United States Patent
Park et al.

(10) Patent No.: US 11,330,537 B2
(45) Date of Patent: May 10, 2022

(54) ELECTRONIC DEVICE AND BANDWIDTH ADAPTATION-BASED POWER CONTROL METHOD IN ELECTRONIC DEVICE

(71) Applicant: SAMSUNG ELECTRONICS CO., LTD., Gyeonggi-do (KR)

(72) Inventors: Sungchul Park, Gyeonggi-do (KR); Suha Yoon, Gyeonggi-do (KR); Euichang Jung, Gyeonggi-do (KR); Suyoung Park, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/044,661

(22) PCT Filed: Apr. 12, 2019

(86) PCT No.: PCT/KR2019/004425
§ 371 (c)(1),
(2) Date: Oct. 1, 2020

(87) PCT Pub. No.: WO2019/199107
PCT Pub. Date: Oct. 17, 2019

(65) Prior Publication Data
US 2021/0105729 A1  Apr. 8, 2021

(30) Foreign Application Priority Data
Apr. 12, 2018  (KR) .................. 10-2018-0042748

(51) Int. Cl.
*H04W 52/52* (2009.01)
*H04W 72/04* (2009.01)

(52) U.S. Cl.
CPC ....... *H04W 52/52* (2013.01); *H04W 72/0453* (2013.01)

(58) Field of Classification Search
CPC .... H04W 52/52; H04W 72/0453; H04B 1/04; H04B 2001/0408; H04B 1/40; H04B 1/401
See application file for complete search history.

(56) References Cited

U.S. PATENT DOCUMENTS

| | | | |
|---|---|---|---|
| 8,818,305 B1 * | 8/2014 | Schwent | H03F 1/0227 455/127.5 |
| 2015/0048891 A1 * | 2/2015 | Rozek | H03F 3/245 330/297 |

(Continued)

FOREIGN PATENT DOCUMENTS

| | | |
|---|---|---|
| KR | 1020160111274 | 9/2016 |
| KR | 1020180031188 | 3/2018 |
| WO | WO2014078103 | 5/2014 |

OTHER PUBLICATIONS

PCT/ISA/210 Search Report issued on PCT/KR2019/004425, dated Jul. 11, 2019, pp. 5.

(Continued)

*Primary Examiner* — Nguyen T Vo
(74) *Attorney, Agent, or Firm* — The Farrell Law Firm, P.C.

(57) ABSTRACT

According to various embodiments, an electronic device includes: a communication processor, a transceiver which is electrically connected to the communication processor, a first power amplifier which is electrically connected to the transceiver; a first antenna which is electrically connected to the first power amplifier; and a first supply adjustor which is electrically connected to the communication processor and the first power amplifier, wherein the communication processor can be set to perform a first determination about whether a first carrier bandwidth part (BP) of a first signal transmitted through the first antenna exceeds a first threshold value, perform a second determination about whether the (Continued)

power of the first signal exceeds a second threshold value, select a first tracking mode as an envelope tracking (ET) mode or an average power tracking (APT) mode on the basis of at least a portion of the first determination and the second determination, and control the first supply adjustor using the selected first tracking mode.

13 Claims, 18 Drawing Sheets

(56) References Cited

U.S. PATENT DOCUMENTS

| | | | |
|---|---|---|---|
| 2016/0105151 A1* | 4/2016 | Langer | H04B 1/0483 330/295 |
| 2016/0173031 A1* | 6/2016 | Langer | H03F 1/0222 330/126 |
| 2016/0277044 A1 | 9/2016 | Song et al. | |
| 2016/0337971 A1 | 11/2016 | Bhargava et al. | |
| 2018/0076520 A1* | 3/2018 | Ma | G01S 13/74 |
| 2019/0372399 A1 | 12/2019 | Park | |

OTHER PUBLICATIONS

PCT/ISA/237 Written Opinion issued on PCT/KR2019/004425, dated Jul. 11, 2019, pp. 6.

MediaTek Inc., 3GPP TSG RAN WG1 Meeting AH 1801, R1-1800148, Vancouver, Canada, Jan. 13, 2018, "Remaining Details on Bandwidth Part Operation in NR", pp. 8.

* cited by examiner

| BWP | Parameter | | Power Supply Mode |
|---|---|---|---|
| | (kHz) | Bandwidth (BWmin - BWmax; MHz) | |
| BWP 1 | 15 | 5 | ET mode |
| BWP 2 | 30 | 20 | ET mode |
| BWP 3 | 60 | 60 | APT mode |
| BWP 4 | 120 | 100 | APT mode |
| BWP 5 | 240 | 400 | Bypass mode |

FIG.11A

| BWP | Bandwidth (BWmin - BWmax; MHz) | Power Supply Mode |
|---|---|---|
| BWP1, BWP3, BWP5 | 5, 10, 20 | ET mode |
| BWP4, BWP7 | 80, 120 | APT mode |
| BWP2 | 400 | Bypass mode |

FIG.11B

| BWP | Bandwidth (BWmin - BWmax; MHz) | Power Supply Mode | Power Supply Modulator |
|---|---|---|---|
| BWP 1, BWP 2 | 40 | ET mode | 1st supply modulator |
| BWP 1, BWP 2, BWP 3 | 140 | APT mode | 1st supply modulator |
| BWP 2, BWP 3 | 120 | APT mode | 1st supply modulator |
| | 120 | ET mode | 2nd supply modulator |
| BWP2, BWP4 | 200 | APT mode | 2nd supply modulator |
| BWP1, BWP5 | 500 | Bypass mode | 2nd supply modulator |

FIG.12

ELECTRONIC DEVICE AND BANDWIDTH ADAPTATION-BASED POWER CONTROL METHOD IN ELECTRONIC DEVICE

CROSS-REFERENCE TO RELATED APPLICATION(S)

This application is a National Phase Entry of PCT International Application No. PCT/KR2019/004425, which was filed on Apr. 12, 2019, and claims priority under 35 U.S.C. § 119 of Korean Patent Application No. 10-2018-0042748, filed on Apr. 12, 2018 in the Korean Intellectual Property Office the disclosure of each of which is incorporated herein by reference in its entirety.

BACKGROUND

1. Field

Various embodiments relate to an electronic device and a bandwidth adaptation-based power control method in an electronic device.

2. Related Art

To meet the demand for wireless data traffic, which has increased since the commercialization of 4G communication systems, efforts have been made to develop next-generation communication systems such as a 5G communication system or a pre-5G communication system.

The 5G communication system is under consideration for implementation and use in new bands, for example, ultra-high-frequency (mmWave) bands (e.g., a 60 GHz band), as well as existing communication bands. In addition, in order to mitigate path loss of radio waves and increase the transmission distance of radio waves, application of techniques such as beamforming, massive multi-input multi-output (massive MIMO), full-dimensional MIMO (FD-MIMO), array antennas, analog beamforming, and large-scale antennas to 5G communication systems is under discussion.

Bandwidth adaptation, which is an example of a technology being considered for application to next-generation communication systems, may be a technique in which an electronic device may select and use the bandwidth of a transmission signal, based on bandwidth information transmitted from a base station.

The bandwidth information transmitted from the base station may include various bandwidths. For example, the bandwidth transmitted from the base station may range from a low-frequency band to an ultra-high-frequency band, and the electronic device may select a transmission bandwidth according to a bandwidth transmitted from the base station from among the low-frequency band to the ultra-high-frequency band, thereby transmitting a signal.

When transmitting a signal, the electronic device may amplify the power of a transmission signal using a power amplifier. According to the prior art, when transmitting a signal, the electronic device may amplify the power of a transmission signal in a determined power control mode regardless of the bandwidth transmitted from the base station. In this case, the determined power control mode may be inefficient for use with the transmission bandwidth selected based on the bandwidth transmitted from the base station.

For example, in the case where the power control mode is determined to be suitable for a low-frequency band rather than a high-frequency band whereas the bandwidth received from the base station is a high-frequency band, the determined power control mode may be difficult to use for the transmission bandwidth determined based on the bandwidth received from the base station.

Various embodiments may provide an electronic device capable of controlling power supply to a power amplifier by selecting a power control mode, based on the bandwidth of a transmission signal, which is determined based on bandwidth information transmitted from a base station, and a bandwidth adaptation-based power control method.

Various embodiments may provide an electronic device capable of controlling power supply to a power amplifier by selecting a power control mode, based on the bandwidth of a transmission signal determined based on bandwidth information transmitted from a base station and the power of the transmission signal, and a bandwidth adaptation-based power control method.

SUMMARY

An electronic device according to various embodiments may include: a communication processor; a transceiver electrically connected to the communication processor; a first power amplifier electrically connected to the transceiver; a first antenna electrically connected to the first power amplifier; and a first supply modulator electrically connected to the communication processor and the first power amplifier, wherein the communication processor may be configured to perform a first determination as to whether or not a first carrier bandwidth part of a first signal transmitted through the first antenna exceeds a first threshold value, perform a second determination as to whether or not the power of the first signal exceeds a second threshold value, select a first tracking mode as an envelope tracking (ET) mode or an average power tracking (APT) mode, based at least partially on the first determination and the second determination, and control the first supply modulator in the selected first tracking mode.

A bandwidth adaptation-based power control method in an electronic device according to various embodiments may include: performing a first determination as to whether or not a first carrier bandwidth part of a first signal transmitted through a first antenna exceeds a first threshold value; performing a second determination as to whether or not the power of the first signal exceeds a second threshold value; selecting a first tracking mode as an envelope tracking (ET) mode or an average power tracking (APT) mode, based at least partially on the first determination and the second determination; and controlling a first supply modulator to adjust the power supplied to a first power amplifier configured to amplify the power of the first signal, based on the selected first tracking mode.

According to various embodiments, an electronic device is able to control power supply to a power amplifier by selecting a power control mode, based on the bandwidth of a transmission signal, which is determined based on bandwidth information transmitted from a base station, and based further on the power of a transmission signal, thereby controlling the power more efficiently.

For example, an electronic device is able to select a power control mode as an envelope tracking (ET) mode, which is efficient for high power of a low-frequency band, or an average power tracking (APT) mode, which is efficient for low power of a high-frequency band, based on whether the bandwidth of a transmission signal determined based on bandwidth information transmitted from a base station is a relatively-low-frequency band or a relatively-high-frequency band and based on whether the transmission signal has low power or high power, thereby improving the performance of power control.

BRIEF DESCRIPTION OF DRAWINGS

FIGS. 11A and 11B are diagrams illustrating examples of a mapping table between carrier bandwidth parts and power supply modes, which is able to be used in the case where one carrier bandwidth is activated, according to various embodiments.

FIG. 12 is a diagram illustrating an example of a mapping table between carrier bandwidth parts, power supply modes, and supply modulators, which is able to be used when a plurality of carrier bandwidth parts is activated, according to various embodiments.

DETAILED DESCRIPTION

Figure 1:
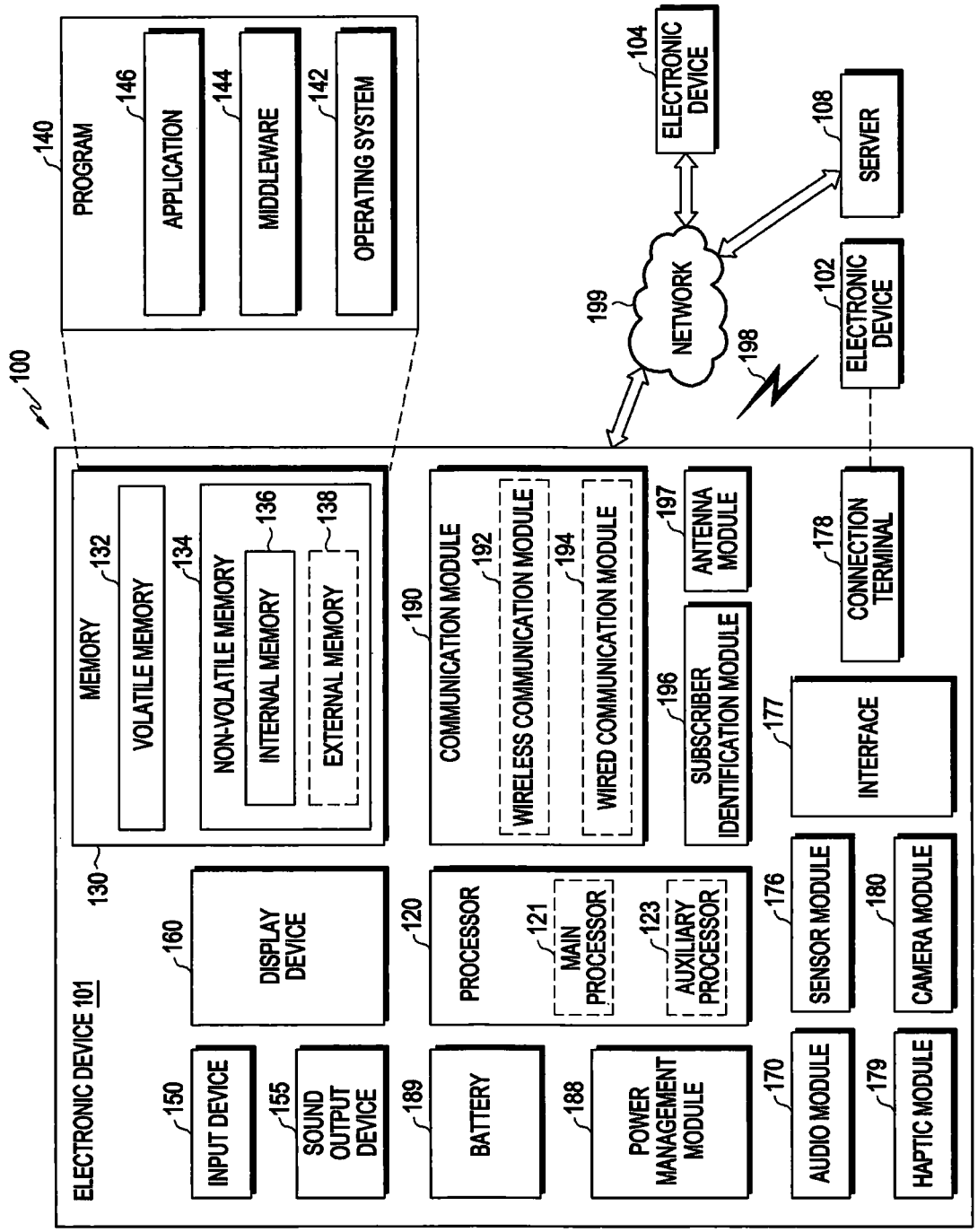
FIG. 1 is a diagram illustrating an electronic device and an external electronic device according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
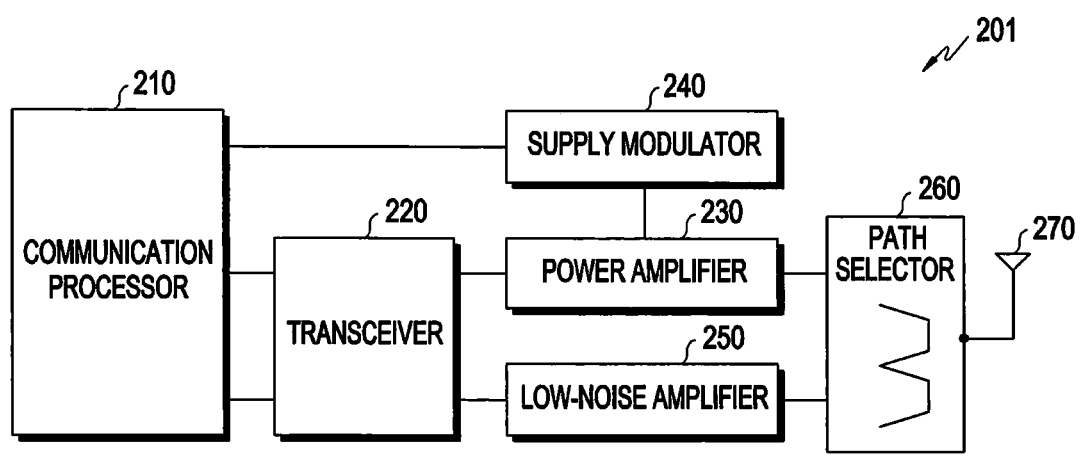
FIG. 2 is a diagram illustrating the configuration of an electronic device according to various embodiments.

FIG. 2 is a diagram illustrating the configuration of a communication circuit of an electronic device (e.g., the electronic device 101 in FIG. 1) according to various embodiments.

Referring to FIG. 2, the communication circuit 201 may include a communication processor 210 (e.g., the communication module 190 in FIG. 1), a transceiver 220, a power amplifier 230, a supply modulator 240, a low-noise amplifier 250, a path selector 260, or an antenna 270.

According to an embodiment, the communication processor 210 may support the establishment of a wireless communication channel between an electronic device (e.g., the electronic device 101 in FIG. 1) and an external electronic device (e.g., the electronic device 102, the electronic device 104, or the server 108 in FIG. 1) and communication through the established communication channel. According to various embodiments, the communication processor 210 may determine bandwidths of transmission and reception signals using bandwidth information received from a base station, based on bandwidth adaptation technology, and may control the transmission and reception of signals using the bandwidths of the transmission and reception signals.

According to various embodiments, the communication processor 210 may receive, from a base station, a carrier bandwidth part including at least a portion of the carrier bandwidth, and may control the transmission and reception of signals using the carrier bandwidth part.

According to various embodiments, the communication processor 210 may produce a baseband signal for wireless communication, thereby providing the same to the transceiver 220, and may control the supply modulator 240 to adjust the power supply to the power amplifier for transmission of the baseband signal.

According to various embodiments, when transmitting signals, the communication processor 210 may select a tracking mode for supplying power to the power amplifier 230, based on the carrier bandwidth part of a transmission signal and the power of a transmission signal, and may control the supply modulator 240, based on the selected tracking mode. According to an embodiment, the communication processor 210 may be configured to perform a first determination as to whether or not the carrier bandwidth part of a transmission signal exceeds a first threshold value, perform a second determination as to whether or not the power of a transmission signal exceeds a second threshold value, select a tracking mode as an envelope tracking (ET) mode or an average power tracking (APT) mode, based at least partially on the first determination and the second determination, and control the supply modulator 240 in the selected tracking mode.

According to an embodiment, the transceiver 220 may convert a baseband transmission signal into an RF signal, or may convert a reception RF signal into a baseband signal. According to various embodiments, the transceiver 220 may convert baseband signals into RF signals in various bands. According to an embodiment, the transceiver 220 may convert a baseband signal into a 5G-based radio frequency (RF) signal in a band of 6 GHz or less or into 2G, 3G, and 4G-based RF signals using a direct conversion transceiver. According to an embodiment, the transceiver 220 may convert a baseband signal into a 5G-based RF signal in a band of 6 GHz or more or into an RF signal in an ultra-high-frequency band, for example, a mmWave band, using a heterodyne transceiver using an intermediate frequency (IF).

According to an embodiment, the power amplifier 230 may amplify a transmission RF signal received from the transceiver 220, thereby transmitting the same to the path selector 260.

According to an embodiment, the supply modulator 240 may adjust the power supplied to the power amplifier 230 for amplifying the transmission RF signal. According to various embodiments, the supply modulator 240 may adjust the power supplied to the power amplifier 230 according to a power supply mode, for example, an envelope tracking (ET) mode or an average power tracking (APT) mode, selected by the communication processor 210.

According to an embodiment, the low-noise amplifier 250 may low-noise-amplify a reception RF signal received from the path selector 260, thereby transmitting the same to the transceiver 220.

According to an embodiment, the path selector 260 may select a path, based on a communication scheme, thereby transmitting a transmission RF signal received from the power amplifier 240 to the antenna 270, and may select a path, based on a communication scheme, thereby transmitting a reception RF signal received through the antenna 270 to the low-noise amplifier 250. According to various embodiments, the path selector 260 may include a duplexer or a switch. For example, the path selector 260 may use a duplexer in the case of a frequency division duplex (FDD) communication scheme, and may use a switch in the case of a time division duplex (TDD) scheme.

According to various embodiments, the communication circuit 201 may include one or more transceivers 220, power amplifiers 230, supply modulators 240, low-noise amplifiers 250, path selectors 260, and antennas 270. For example, a pair of transceivers 220, power amplifiers 230, supply modulators 240, low-noise amplifiers 250, path selectors 260, and antennas 270 may produce transmission/reception paths for at least one communication scheme (e.g., a 2G, 3G, 4G, or 5G communication scheme).

According to various embodiments, the communication circuit 201 may include a communication circuit for processing a 5G-based signal in a band of 6 GHz or less or 2G-, 3G-, and 4G-based signals, or a communication circuit for processing a 5G-based signal in a band of 6 GHz or more or signals in ultra-high-frequency bands (mmWave).

Figure 3:
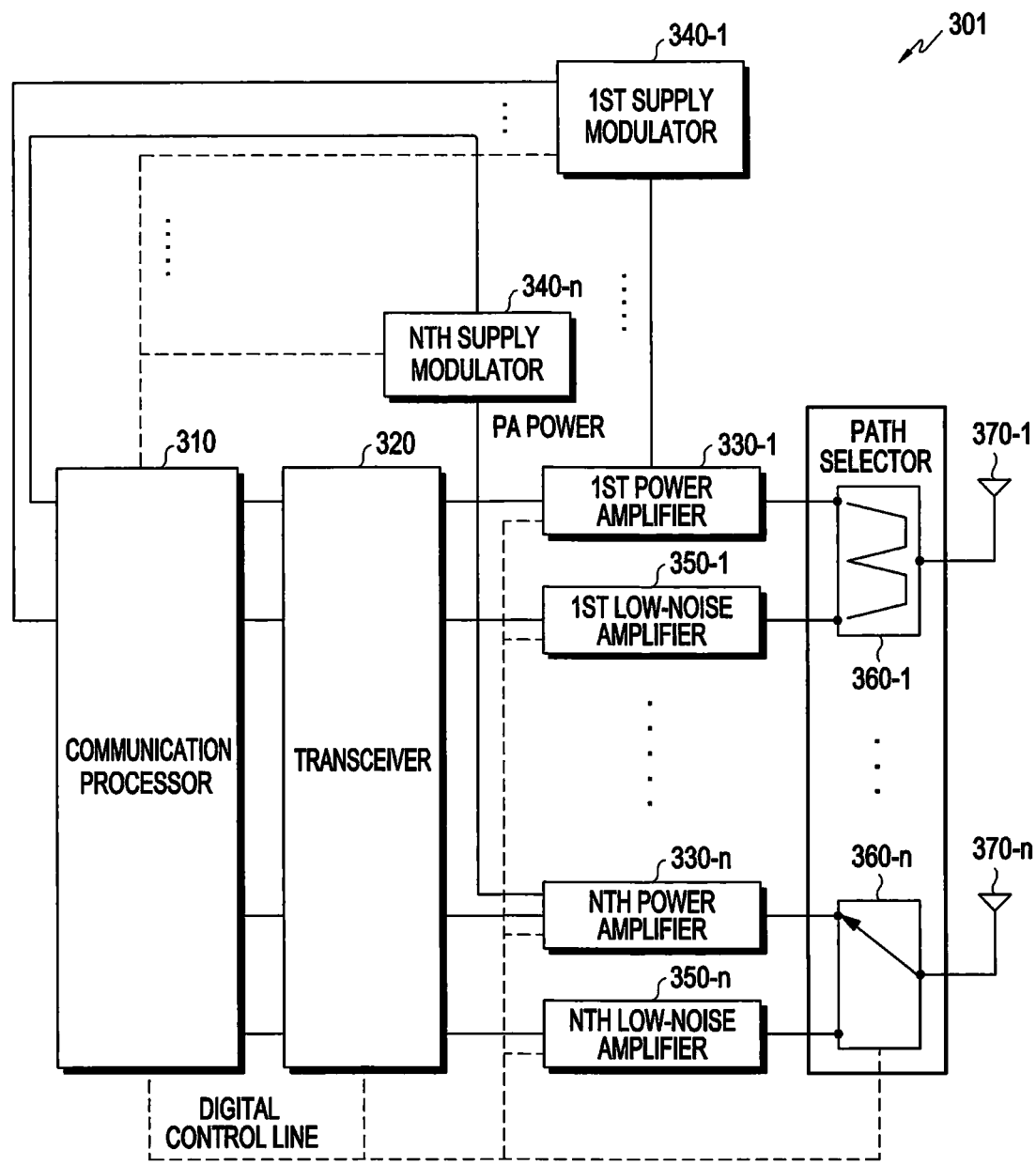
FIG. 3 is a diagram illustrating an example of a communication circuit for processing a signal in a band of 6 GHz or less according to various embodiments.

FIG. 3 is a diagram illustrating an example of a communication circuit for processing a signal in a band of 6 GHz or less according to various embodiments.

Referring to FIG. 3, an electronic device (e.g., the electronic device 101 in FIG. 1) according to an embodiment may include a communication circuit 301, and the communication circuit 301 may include a communication processor 310 (e.g., the communication module 190 in FIG. 1 or the communication processor 210 in FIG. 2), a transceiver 320, $1^{st}$ to $n^{th}$ power amplifiers 330-1 to 330-$n$, $1^{st}$ to $n^{th}$ supply modulators 340-1 to 340-$n$, $1^{st}$ to $n^{th}$ low-noise amplifiers 350-1 to 350-$n$, $1^{st}$ to $n^{th}$ path selectors 360-1 to 360-$n$, or $1^{st}$ to $n^{th}$ antennas 370-1 to 370-$n$.

According to an embodiment, the communication processor 310 may support the establishment of a wireless communication channel between an electronic device and an external electronic device (e.g., the electronic device 102, the electronic device 104, or the server 108 in FIG. 1) and communication through the established communication channel. According to various embodiments, the communication processor 310 may determine the bandwidths of transmission and reception signals using bandwidth information received from a base station, based on bandwidth adaptation technology, and may control the transmission and reception of signals using the bandwidths of the transmission and reception signals. According to various embodiments, the communication processor 310 may receive, from a base station, a carrier bandwidth part including at least a portion of the carrier bandwidth, and may control the transmission and reception of signals using the received carrier bandwidth part.

According to various embodiments, the communication processor 310 may produce a baseband signal for wireless communication, thereby providing the same to the transceiver 320, and may control the $1^{st}$ to $n^{th}$ supply modulators 340-1 to 340-$n$ to adjust the power supply to the $1^{st}$ to $n^{th}$ power amplifiers 330-1 to 330-$n$ for transmission of the baseband signal. According to various embodiments, when transmitting signals, the communication processor 310 may select a tracking mode for the $1^{st}$ to $n^{th}$ power amplifiers 330-1 to 330-$n$, based on the carrier bandwidth part and the power of a transmission signal, and may control the $1^{st}$ to $n^{th}$ supply modulators 340-1 to 340-$n$, based on the selected tracking mode.

According to an embodiment, the communication processor 310 may be configured to perform a first determination as to whether or not the carrier bandwidth part of a first transmission signal transmitted using the first power amplifier 330-1, the first path selector 360-1, and the first antenna 370-1 exceeds a first threshold value, perform a second determination as to whether or not the power of the first transmission signal exceeds a second threshold value, select a tracking mode as an envelope tracking (ET) mode or an average power tracking (APT) mode, based at least partially on the first determination and the second determination, and control the first supply modulator 340-1 in the selected tracking mode.

According to an embodiment, the communication processor 310 may be configured to perform a third determination as to whether or not the carrier bandwidth part of a second transmission signal transmitted using the second power amplifier 330-2, the second path selector 360-2, and the second antenna 370-2 exceeds a first threshold value, perform a fourth determination as to whether or not the power of the second transmission signal exceeds a second threshold value, select a tracking mode as an envelope tracking (ET) mode or an average power tracking (APT) mode, based at least partially on the third determination and the fourth determination, and control the second supply modulator in the selected tracking mode.

According to various embodiments, the transceiver 320 may convert a baseband transmission signal into an RF signal, or may convert a reception RF signal into a baseband signal. For example, the transceiver 320 may convert a baseband signal into a 5G-based radio frequency (RF) signal in a band of 6 GHz or less or into 2G-, 3G-, and 4G-based RF signals using a direct conversion transceiver.

According to various embodiments, the $1^{st}$ to $n^{th}$ power amplifiers 330-1 to 330-$n$ may amplify $1^{st}$ to $n^{th}$ transmission signals received from the transceiver 320, thereby transmitting the same to the $1^{st}$ to $n^{th}$ path selectors 360-1 to 360-$n$.

According to various embodiments, the $1^{st}$ to $n^{th}$ supply modulators 340-1 to 340-$n$ may adjust the power supplied to the $1^{st}$ to $n^{th}$ power amplifiers 330-1 to 330-$n$ for amplifying the transmission RF signals. According to various embodiments, the $1^{st}$ to $n^{th}$ supply modulators 340-1 to 340-$n$ may adjust the power supplied to the $1^{st}$ to $n^{th}$ power amplifiers 330-1 to 330-$n$ according to a power supply mode, for example, an envelope tracking (ET) mode or an average power tracking (APT) mode, selected by the communication processor 310.

According to various embodiments, the $1^{st}$ to $n^{th}$ low-noise amplifiers 350-1 to 350-$n$ may low-noise-amplify the reception RF signals received from the $1^{st}$ to $n^{th}$ path selectors 360-1 to 360-$n$, thereby transmitting the same to the transceiver 320.

According to various embodiments, the $1^{st}$ to $n^{th}$ path selectors 360-1 to 360-$n$ may select paths, based on communication schemes, thereby transmitting the reception RF signals received from the $1^{st}$ to $n^{th}$ power amplifiers 330-1 to 330-$n$ to the $1^{st}$ to $n^{th}$ antennas 370-1 to 370-$n$. As another example, the $1^{st}$ to $n^{th}$ path selectors 360-1 to 360-$n$ may select paths, based on communication schemes, thereby transmitting the reception RF signals received through the $1^{st}$ to $n^{th}$ antennas 370-1 to 370-$n$ to the $1^{st}$ to $n^{th}$ low-noise amplifiers 350-1 to 350-$n$.

According to various embodiments, the $1^{st}$ to $n^{th}$ low-noise amplifiers 350-1 to 350-$n$ may include duplexers or switches. For example, the $1^{st}$ to $n^{th}$ low-noise amplifiers 350-1 to 350-$n$ may use duplexers in the case of a frequency division duplex (FDD) communication scheme, and may use switches in the case of a time division duplex (TDD) scheme.

According to various embodiments, the communication circuit 301 may produce a plurality of RF signal paths. For example, the communication circuit 301 may produce a first RF signal path using the transceiver 320, the first power amplifier 330-1, the first supply modulator 340-1, the first low-noise amplifier 350-1, the first path selector 360-1, and the first antenna 370-1, and may produce a second RF signal path using the transceiver 320, the second power amplifier 330-2, the second supply modulator 340-2, the second low-noise amplifier 350-2, the second path selector 360-2, and the second antenna 370-2.

According to an embodiment, the communication circuit 301 may perform beamforming using a plurality of RF signal paths. For example, in the case of beamforming, the $1^{st}$ to $n^{th}$ antennas 370-1 to 370-$n$ may include phased array antennas.

According to various embodiments, an electronic device (e.g., the electronic device 101 in FIG. 1) may include: a communication processor (e.g., the communication module 190 in FIG. 1, the communication processor 210 in FIG. 2, or the communication processor 310 in FIG. 3); a transceiver (e.g., the transceiver 220 in FIG. 2 or the transceiver 320 in FIG. 3) electrically connected to the communication processor; a first power amplifier (e.g., the power amplifier 230 in FIG. 2 or the first power amplifier 330-1 in FIG. 3) electrically connected to the transceiver; a first antenna (e.g., the antenna 270 in FIG. 2 or the first antenna 370-1 in FIG. 3) electrically connected to the first power amplifier; and a first supply modulator (e.g., the supply modulator 240 in FIG. 2 or the first supply modulator 340-1 in FIG. 3) electrically connected to the communication processor and the first power amplifier, wherein the communication processor may be configured to perform a first determination as to whether or not a carrier bandwidth part of a first signal transmitted through the first antenna exceeds a first threshold value, perform a second determination as to whether or not the power of the first signal exceeds a second threshold value, select a first tracking mode as an envelope tracking (ET) mode or an average power tracking (APT) mode, based at least partially on the first determination and the second determination, and control the first supply modulator in the selected first tracking mode.

According to various embodiments, the electronic device (e.g., the electronic device 101 in FIG. 1) may further include: a second power amplifier (e.g., the $n^{th}$ power amplifier 330-$n$ in FIG. 3 electrically connected to the transceiver (e.g., the transceiver 220 in FIG. 2 or the transceiver 320 in FIG. 3); a second antenna (e.g., the $n^{th}$ antenna 370-$n$ in FIG. 3) electrically connected to the second power amplifier; and a second supply modulator (e.g., the $n^{th}$ supply modulator 340-$n$ in FIG. 3) electrically connected to the communication processor and the second power amplifier, wherein the communication processor may be configured to perform a third determination as to whether or not a carrier bandwidth part associated with a second signal transmitted through the second antenna exceeds a first threshold value, perform a fourth determination as to whether or not the power of the second signal exceeds a second threshold value, select a second tracking mode as the ET mode or the APT mode, based at least partially on the third determination and the fourth determination, and control the second supply modulator in the selected second tracking mode.

According to various embodiments, the communication processor may be configured to receive information on the carrier bandwidth part from a base station.

According to various embodiments, the communication processor may be configured to perform the second determination after performing the first determination.

According to various embodiments, the communication processor may be configured to perform a fifth determination to determine whether or not the bandwidth of the transmitted first signal is less than a third threshold value and select a first tracking mode, based at least partially on the fifth determination and the first determination, select a first tracking mode, based at least partially on the fifth determination and the second determination, or select a first tracking mode, based at least partially on the fifth determination, the first determination, and the second determination.

According to various embodiments, the second signal may be a signal obtained by phase-shifting the first signal, based on a predetermined angle.

According to various embodiments, the information on the carrier bandwidth part may include bandwidth information associated with at least one carrier bandwidth part included in the carrier bandwidth and bandwidth information associated with at least one physical resource block included in the at least one carrier bandwidth part.

According to various embodiments, the communication processor may be configured to store a mapping table between the carrier bandwidth part and the tracking mode.

According to various embodiments, the first antenna and the second antenna may include phased array antennas.

According to various embodiments, the first antenna and the second antenna may include waveguide array antennas.

Figure 4:
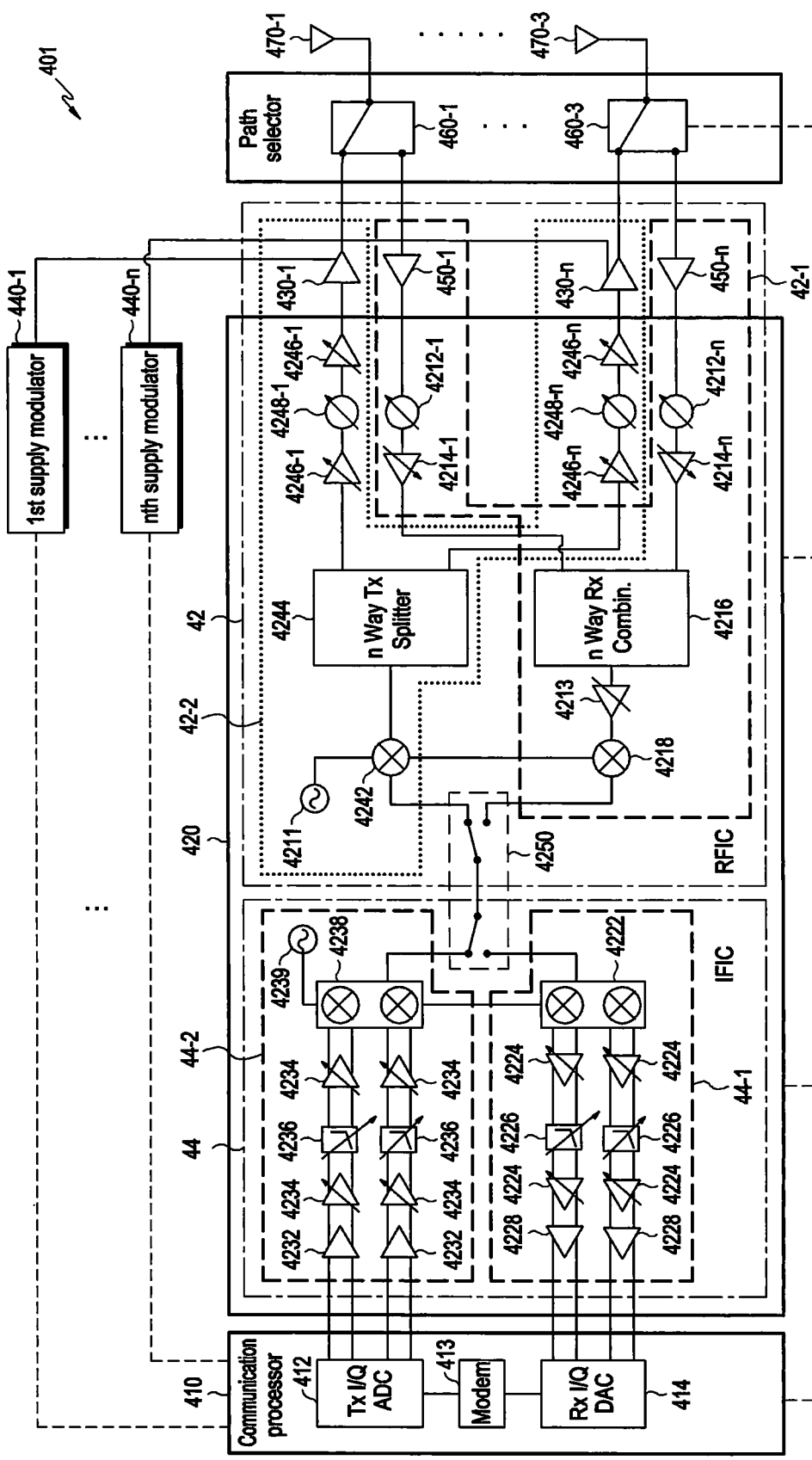
FIG. 4 is a diagram illustrating an example of a communication circuit for processing a signal in a band of 6 GHz or more according to various embodiments.

FIG. 4 is a diagram illustrating an example of a communication circuit for processing a signal in a band of 6 GHz or more according to various embodiments.

Referring to FIG. 4, according to an embodiment, an electronic device (e.g., the electronic device 101 in FIG. 1) may include a communication circuit 401 capable of processing a 6 GHz band signal, for example, an ultra-high-frequency band signal.

According to various embodiments, the communication circuit 401 may include a communication processor 410 (e.g., the communication module 190 in FIG. 1 or the communication processor 210 in FIG. 2), a transceiver 420, $1^{st}$ to $n^{th}$ power amplifiers 430-1 to 430-$n$, $1^{st}$ to $n^{th}$ supply modulators 440-1 to 440-$n$, $1^{st}$ to $n^{th}$ low-noise amplifiers 450-1 to 450-$n$, $1^{st}$ $n^{th}$ path selectors 460-1 to 460-$n$, or $1^{st}$ to $n^{th}$ antennas 470-1 to 470-$n$.

According to various embodiments, the transceiver 420, the $1^{st}$ to $n^{th}$ power amplifiers 430-1 to 430-$n$, and the $1^{st}$ to $n^{th}$ low-noise amplifiers 450-1 to 450-$n$ may be included in one or more integrated chips (ICs). For example, the transceiver 420, the $1^{st}$ to $n^{th}$ power amplifiers 430-1 to 430-$n$, and the $1^{st}$ to $n^{th}$ low-noise amplifiers 450-1 to 450-$n$ may be included in at least part of a radio frequency (RF) IC 42 and an intermediate frequency (IF) IC 44.

According to various embodiments, the communication processor 410 may produce a baseband signal for wireless communication, thereby transmitting the same to the transceiver 420, and may receive a baseband signal received from the transceiver 420.

According to various embodiments, the communication processor 410 may include a Tx I/Q DAC 412, a modem 413, or an Rx I/Q ADC 414. The communication processor 410 may convert a digital signal modulated by the modem 413 into a balanced Tx/Q signal through the Tx I/Q DAC 412, thereby transmitting the same to the transceiver 420, and may covert a balanced Rx I/Q signal, which is a transmission signal received from the transceiver 420, into a digital signal through the Rx I/Q ADC 414, thereby transmitting the converted digital signal to the modem 413. According to various embodiments, the communication processor 410 may be a communication processor including the Tx I/Q DAC 412, the modem 413, or the Rx I/Q ADC 414, or may be a processor integrated with another processor (e.g., an application processor (AP)) capable of processing functions other than communication.

According to various embodiments, the communication processor 410 may control the $1^{st}$ to $n^{th}$ supply modulators 440-1 to 440-$n$ to adjust the power supply to the $1^{st}$ to $n^{th}$ power amplifiers 430-1 to 430-$n$ for transmission of transmission signals. According to an embodiment, the communication processor 410 may select a tracking mode for the $1^{st}$ to $n^{th}$ power amplifiers 430-1 to 430-$n$, based on the carrier bandwidth part of a balanced Tx I/Q signal and the power of a transmission signal, and may control the $1^{st}$ to $n^{th}$ supply modulators 440-1 to 440-$n$, based on the selected tracking mode. According to an embodiment, the communication processor 410 may be configured to perform a first determination as to whether or not the carrier bandwidth part of a first transmission signal transmitted using the first power amplifier 430-1, the first path selector 460-1, and the first antenna 470-1 exceeds a first threshold value, perform a second determination as to whether or not the power of the first transmission signal exceeds a second threshold value, select a tracking mode as an envelope tracking (ET) mode or an average power tracking (APT) mode, based at least partially on the first determination and the second determination, and control the first supply modulator 440-1 in the selected tracking mode. According to an embodiment, the communication processor 410 may be configured to perform a third determination as to whether or not the carrier bandwidth part of a second transmission signal transmitted using the second power amplifier 430-2, the second path selector 460-2, and the second antenna 470-2 exceeds a first threshold value, perform a fourth determination as to whether or not the power of the second transmission signal exceeds a second threshold value, select a tracking mode as an envelope tracking (ET) mode or an average power tracking (APT) mode, based at least partially on the third determination and the fourth determination, and control the second supply modulator in the selected tracking mode.

According to various embodiments, the transceiver 420 may include n transmission/reception chains. The n transmission/reception chains may include, for example, n transmission chains and n reception chains. The n reception chains may include a reception RF processor 42-1 and a reception IF processor 44-1, and the n transmission chains may include a transmission IF processor 42-2 and a transmission RF processor 44-2. According to an embodiment, the reception RF processor 42-1 and the transmission RF processor 42-2 may be included in an RFIC 42, and the transmission IF processor 44-2 and the reception IF processor 44-1 may be included in an IFIC 44. The transceiver 420 may include a switch 4250 for connecting the transmission IF processor 44-2 to the transmission RF processor 42-2 and connecting the reception IF processor 44-1 to the reception RF processor 42-1.

According to various embodiments, the transceiver 420 may convert a plurality of reception RF signals into IF signals through the reception RF processor 42-1, and may convert the converted IF signals into reception band signals through the reception IF processor 44-1. The transceiver 420 may convert transmission band signals into IF signals through the transmission IF processor 44-2, and may convert the converted IF signals into a plurality of RF signals through the transmission RF processor 42-2.

According to various embodiments, the reception RF processor 42-1 may receive a plurality of reception RF signals through the $1^{st}$ to $n^{th}$ low-noise amplifiers 450-1 to 450-*n*, the $1^{st}$ to $n^{th}$ path selectors 460-1 to 460-*n*, and the $1^{st}$ to $n^{th}$ antennas 470-1 to 470-*n*. According to an embodiment, the reception RF processor 42-1 may convert a plurality of reception RF signals into a plurality of IF signals. According to various embodiments, the plurality of RF signals may be phase-shifted beamforming signals. According to an embodiment, the reception RF processor 42-1 may include $1^{st}$ to $n^{th}$ phase shifters 4212-1 to 4212-*n*, $1^{st}$ to $n^{th}$ RX VGAs 4214-1 to 4214-*n*, or a combination (n-way Rx combination) 4216. The $1^{st}$ to $n^{th}$ phase shifters 4212-1 to 4212-*n* may shift the phases of a plurality of reception RF signals, for example, $1^{st}$ to $n^{th}$ reception RF signals, according to a beamforming angle, and may output a plurality of reception RF signals in phase. The $1^{st}$ to $n^{th}$ RX VGAs 4214-1 to 4214-*n* may include one or more VGAs, and may perform automatic gain control (AGC) for each of a plurality of reception RF signals. The combination (n-way Rx combination) 4216 may combine the plurality of reception RF signals in phase. The combined reception RF signal may be transmitted to a mixer 4218. Automatic gain control (AGC) may be performed on the combined reception RF signal by the VGA 4219 before it is transmitted to the mixer 4218. The mixer 4218 may down-convert the combined reception RF signal from an RF band to an IF band using a signal from an internal or external oscillator 4211. The down-converted IF signal may be transmitted to the reception IF processor 44-1 through the switch 4250 to then be processed.

According to various embodiments, the reception RF processor 42-1 may convert the down-converted IF signal into a digital signal, and may transmit the same to the communication processor 410. According to an embodiment, the reception IF processor 44-1 may include a mixer 4222, one or more Rx VGAs 4224, LPFs 4226, and buffers 4228. The mixer 4222 may down-convert the down-converted IF signal into a reception IF signal, thereby producing a balanced Rx I/Q signal. The LPF 4226 may function as a channel filter by configuring the bandwidth of the balanced Rx I/Q signal as a cutoff frequency. One or more Rx VGAs 4224 may perform automatic gain control (AGC) on the balanced Rx I/Q signal. The buffer 4228 may temporarily store the balanced Rx I/Q signal so that the balanced Rx I/Q signal may be stably transmitted to the Rx I/O DAC 414 of the communication processor 410. The balanced Rx I/Q signal transmitted to the Rx I/O DAC 414 may be demodulated by a modem, thereby processing the received signal.

According to various embodiments, the transmission IF processor 44-2 may include buffers 4232, TX variable gain amplifiers (VGAs) 4234, low-pass filters (LPFs) 4236, or a mixer 4238. The buffer 4232 may temporarily store the received balanced Tx I/Q signal, thereby stably processing the signal. The TX VGAs 4234 may include one or more VGAs, and may perform automatic gain control (AGC) on a transmission signal. The LPF 4236 may function as a channel filter for operating the bandwidth of a balanced Tx I/Q signal according to a cutoff frequency, and the cutoff frequency may be variable. The mixer 4238 may receive a signal from an oscillator 4239, and may up-convert a balanced Tx I/Q signal to a transmission IF signal. The up-converted transmission IF signal may be transmitted to the transmission RF processor 42-2 through the switch 4250 to then be processed.

According to various embodiments, the transmission RF processor 42-2 may receive IF signals, and may convert the same into a plurality of RF signals. According to various embodiments, the plurality of RF signals may be phase-shifted beamforming signals. According to an embodiment, the transmission RF processor 42-2 may include a mixer 4242, a splitter (n-way tx splitter) 4244, $1^{st}$ to $n^{th}$ TX VGAs 4246-1 to 4246-*n*, or $1^{st}$ to $n^{th}$ phase shifters 4248-1 to 4248-*n*.

The mixer 4242 may up-convert a transmission IF signal into an RF band signal using a signal from an oscillator 4211. The splitter (n-way tx splitter) 4244 may divide the transmission RF signal up-converted by the mixer 4242 into n transmission RF signals.

The $1^{st}$ to $n^{th}$ TX VGAs 4246-1 to 4246-*n* may perform an auto gain control (AGC) operation on the n transmission RF signals according to a control signal of the communication processor 410. According to an embodiment, the number of VGAs may increase or decrease depending on the case.

The $1^{st}$ to $n^{th}$ phase shifters 4248-1 to 4248-*n* may shift the phases of the n transmission RF signals according to a beamforming angle using a control signal from the communication processor 410. Based on the phase shift, the n transmission RF signals may be output as beamforming signals having different phases.

According to various embodiments, the $1^{st}$ to $n^{th}$ power amplifiers 430-1 to 430-*n* may amplify the $1^{st}$ to $n^{th}$ transmission signals received from the transceiver 420, and may transmit the same to the $1^{st}$ to $n^{th}$ path selectors 460-1 to 460-*n*.

The $1^{st}$ to $n^{th}$ supply modulators 440-1 to 440-*n* may adjust the power supplied to the $1^{st}$ to $n^{th}$ power amplifiers 430-1 to 430-*n* in order to amplify n transmission signals. According to various embodiments, the $1^{st}$ to $n^{th}$ supply modulators 440-1 to 440-*n* may adjust the power supplied to the $1^{st}$ to $n^{th}$ power amplifiers 430-1 to 430-*n* according to the power supply mode, for example, an envelope tracking (ET) mode or an average power tracking (APT) mode, selected by the communication processor 410.

The $1^{st}$ to $n^{th}$ path selectors 460-1 to 460-*n* may select appropriate paths, based on communication schemes, thereby transmitting transmission signals from the $1^{st}$ to $n^{th}$ power amplifiers 430-1 to 430-*n* to the $1^{st}$ to $n^{th}$ antennas 470-1 to 470-*n*, and may select appropriate paths, based on communication schemes, thereby transmitting reception RF signals received through the $1^{st}$ to $n^{th}$ antennas 470-1 to 470-*n* to the $1^{st}$ to $n^{h}$ low-noise amplifiers 450-1 to 450-*n*. According to various embodiments, the $1^{st}$ to $n^{th}$ low-noise amplifiers 450-1 to 450-*n* may include duplexers or switches. For example, the $1^{st}$ to $n^{th}$ low-noise amplifiers 450-1 to 450-*n* may use duplexers in the case of a frequency division duplex (FDD) communication scheme, and may use switches in the case of a time division duplex (TDD) scheme.

The $1^{st}$ to $n^{th}$ antennas 470-1 to 470-*n* may operate as antenna elements of phased array antennas. The phased array antennas may perform beamforming.

Figure 5:
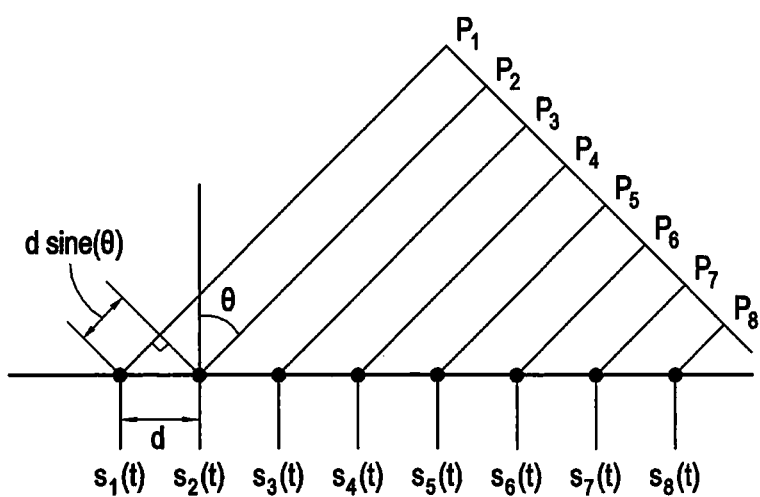
FIG. 5 is a diagram for explaining a method of transmitting a beamforming signal according to various embodiments.

FIG. 5 is a diagram for explaining a method of transmitting a beamforming signal according to various embodiments.

Referring to FIG. 5, Sn(t) may represent an antenna. According to various embodiments, an electronic device (e.g., the electronic device 101 in FIG. 1, the communication circuit 201 in FIG. 2, the communication circuit 301 in FIG.

3, or the communication circuit 401 in FIG. 4) may include a plurality of antennas, and may transmit beamforming signals on which beam steering is performed by an angle of θ using a plurality of antennas. According to an embodiment, an electronic device (e.g., the electronic device 101 in FIG. 1, the communication circuit 201 in FIG. 2, the communication circuit 301 in FIG. 3, or the communication circuit 401 in FIG. 4) may include eight antennas $S1(t)$ to $S8(t)$, and may apply the same signals having different phases to the antennas $S1(t)$ to $S8(t)$. For example, the electronic device may apply a phase delay to a plurality of transmission signals, based on Equation 1 below, and may apply the same signals having different phases to the antennas $S1(t)$ to $S8(t)$ so that antennas $S1(t)$ to $S8(t)$ may simultaneously output signals having different phases, for example, signals P1 to P8.

delay time=$t$=$d \sin(\theta)/c$ phase delay=$2\pi fd \sin(\theta)/c = 2\pi ft$ [Equation 1]

In Equation 1, t is a delay time, d is a distance, θ is an incident angle, f is a frequency, and c is the speed of light.

The electronic device may apply a phase delay to a plurality of transmission signals, based on Equation 1 above, thereby applying the same signals having different phases to the antennas $S1(t)$ to $S8(t)$.

Figure 6A:
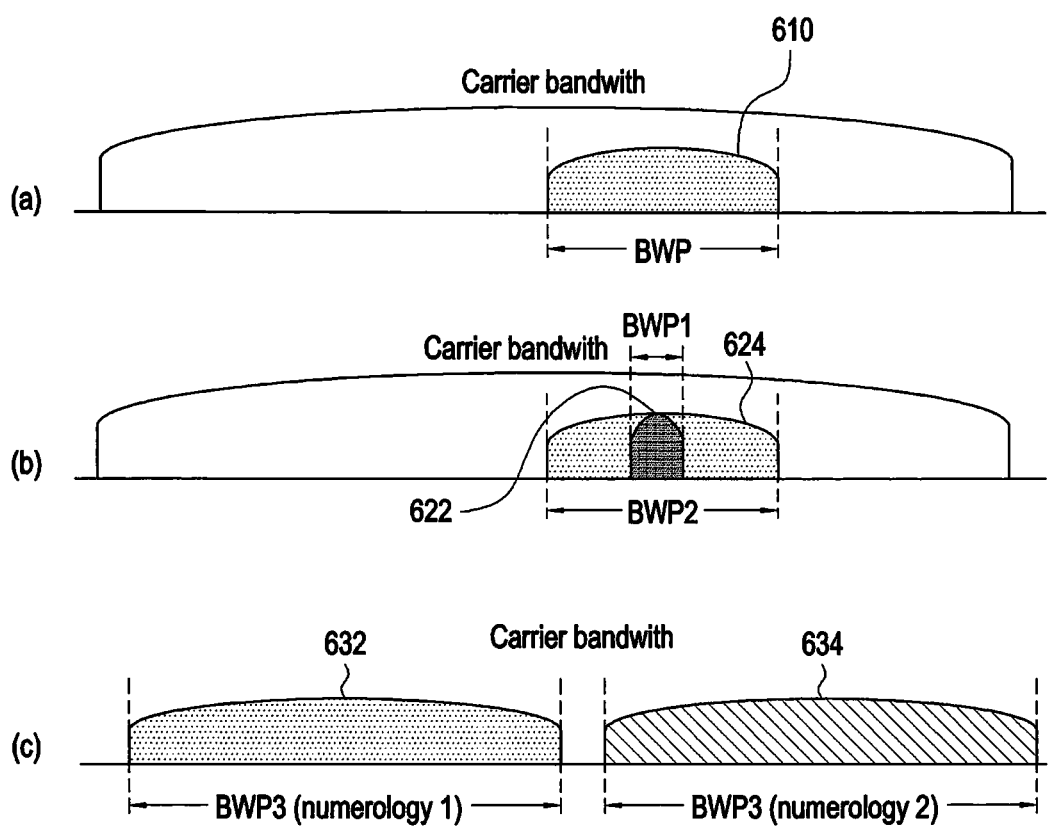
FIGS. 6A and 6B are diagrams for explaining a bandwidth adaptation technique according to various embodiments.
Figure 6B:
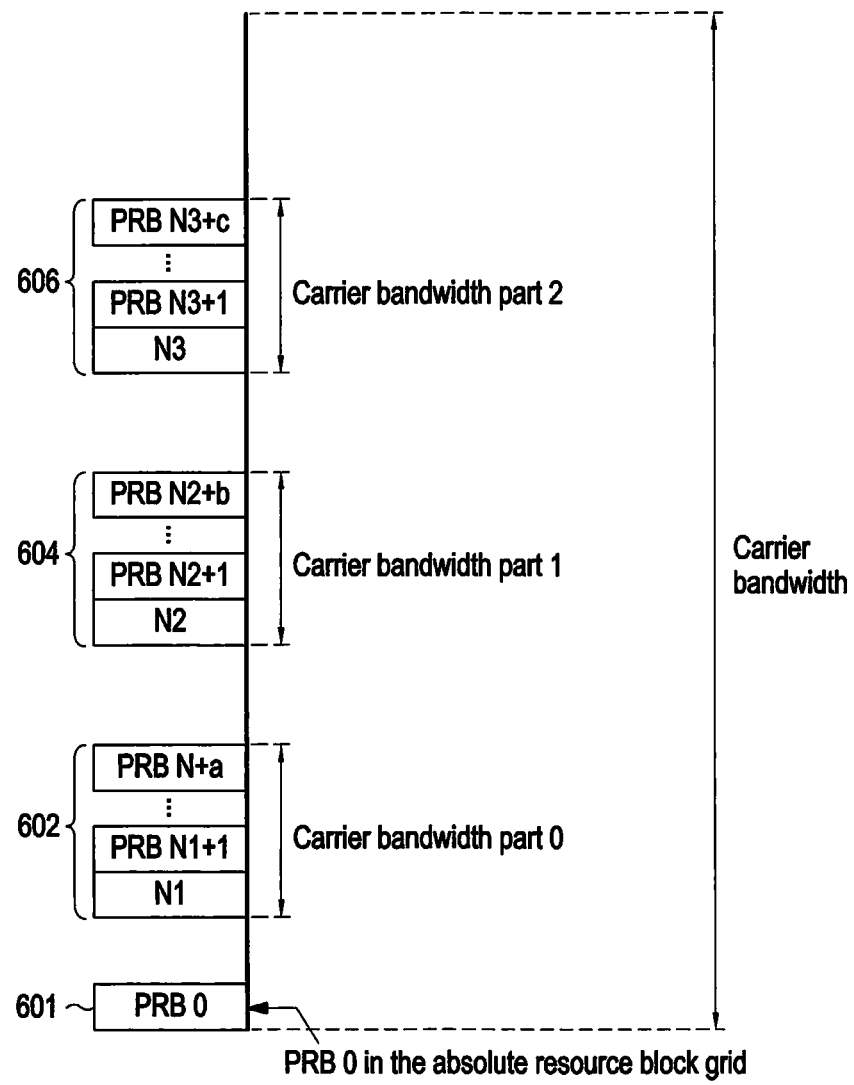

FIGS. 6A and 6B are diagrams for explaining a bandwidth adaptation technique according to various embodiments.

Referring to FIG. 6A, as shown in 601 to 603 in FIG. 6A, a base station may provide information on a carrier bandwidth part (hereinafter also referred to as a "BWP") associated with a carrier bandwidth. An electronic device (e.g., the electronic device 101 in FIG. 1, the communication circuit 201 in FIG. 2, the communication circuit 301 in FIG. 3, or the communication circuit 401 in FIG. 4) may receive information on the BWP from a base station. According to various embodiments, the information on the BWP may include bandwidth part configuration information. According to an embodiment, the bandwidth part configuration information may include configuration values necessary in order for the electronic device to use the bandwidth of a transmission signal as a carrier bandwidth part. For example, the bandwidth part configuration information may include the position of a frequency resource of the BWP, the bandwidth of a frequency resource of the BWP, and numerology information related to the operation of the BWP. According to an embodiment, the numerology information on the BWP may include at least one of subcarrier spacing (SCS) information, the type of cyclic prefix of orthogonal frequency division multiplexing (OFDM) (e.g., the type indicating a normal cyclic prefix or an extended cyclic prefix), and the number of symbols included in one slot (e.g., 7 symbols or 14 symbols). According to various embodiments, an electronic device (e.g., the electronic device 101 in FIG. 1, the communication circuit 201 in FIG. 2, the communication circuit 301 in FIG. 3, or the communication circuit 401 in FIG. 4) may activate at least one BWP, based on the bandwidth part configuration information received from the base station, and may transmit and receive control signals or data, based on the activated BWP.

Referring to 601 in FIG. 6A, an electronic device (e.g., the electronic device 101 in FIG. 1, the communication circuit 201 in FIG. 2, the communication circuit 301 in FIG. 3, or the communication circuit 401 in FIG. 4) may receive bandwidth part configuration information on one BWP 610 from a base station, and may activate the BWP 610, based on the bandwidth part configuration information on the BWP 610. According to an embodiment, the BWP 610 may be an operation band configured based on the RF performance of the electronic device.

Referring to 602 in FIG. 6A, an electronic device (e.g., the electronic device 101 in FIG. 1, the communication circuit 201 in FIG. 2, the communication circuit 301 in FIG. 3, or the communication circuit 401 in FIG. 4) may receive bandwidth part configuration information on a plurality of BWPs (e.g., BWP1 622 and BWP2 624) from a base station. According to an embodiment, the plurality of BWPs may include BWPs (e.g., BWP1 622) associated with a basic operation band configured based on the RF performance of the electronic device, and may further include BWPs (e.g., BWP2 624) associated with an additional operation band. According to various embodiments, there may be one or more BWPs associated with the additional operation band. According to various embodiments, the BWP associated with the additional operation band may have numerology characteristics different from those of the basic operation band. According to various embodiments, two or more BWPs associated with the additional operation band may have different numerology characteristics from each other. The electronic device may select and activate one of BWP1 622 and BWP2 624, based on bandwidth part configuration information on BWP1 622 and bandwidth part configuration information on BWP2 624. According to an embodiment, the network may instruct a terminal to select and activate one of BWP1 622 and BWP2 624.

Referring to 603 in FIG. 6A, an electronic device (e.g., the electronic device 101 in FIG. 1, the communication circuit 201 in FIG. 2, the communication circuit 301 in FIG. 3, or the communication circuit 401 in FIG. 4) may receive, from a base station, bandwidth part configuration information on a plurality of BWPs (e.g., BWP3 (numerology1) 632 and BWP3 (numerology2) 634) having different numerology characteristics from each other. According to an embodiment, a plurality of BWPs may include BWP3 (numerology1) 632 having a first numerology characteristic or BWP3 (numerology2) 634 having a second numerology characteristic. The electronic device, may select and activate at least one of BWP3 (numerology1) 632 and BWP3 (numerology2) 634, based on the numerology information included in the bandwidth part configuration information on BWP3 (numerology 1) 632 and the bandwidth part configuration information on BWP3 (numerology2) 634. For example, one of BWP3 (numerology1) 632 and BWP3 (numerology2) 634 may be selected and activated based on one of subcarrier spacing (SCS) information, the type of cyclic prefix of OFDM (e.g., type indicating a normal cyclic prefix or an extended cyclic prefix), or the number of symbols (e.g., 7 symbols or 14 symbols) included in one slot, among numerology information included in the bandwidth part configuration information on BWP3 (numerology1) 632 and the bandwidth part configuration information on BWP3 (numerology2) 634.

According to various embodiments, the electronic device may select a BWP to be activated from among a plurality of BWPs, based on the reception of a radio resource control (RRC) signal from a base station, or may select a BWP to be activated based on activation/deactivation information included in at least one piece of bandwidth part configuration information among bandwidth part configuration information on a plurality of BWPs. As another example, the electronic device may select a BWP to be activated based on the reception of downlink control information (DCI) from a base station. As another example, the electronic device may select a BWP to be activated based on the reception of MAC control element (MAC CE) from a base station.

According to an embodiment, in the case of using an RRC signal, the base station may include information on frequency resources allocated from the network or at least one piece of BWP-related time information in the RRC signal, and may transmit the RRC signal. For example, the electronic device may select and activate one of the BWPs, based on the information on frequency resources allocated from the network included in the RRC signal or the at least one piece of BWP-related time information included in the RRC signal. For example, at least one piece of BWP-related time information may include a time pattern for changing the BWPs. The time pattern may include operation slot information or subframe information on the BWPs, or specified operation times of the BWPs.

According to an embodiment, in the case of using bandwidth part configuration information, a bit map indicating activation/deactivation may be included in the bandwidth part configuration information on the BWPs. The electronic device may select a BWP to be activated based on the bit map. For example, the bitmap may have a value of 0 or 1, wherein the value of 0 (or 1 or another specified value) may indicate activation and the value of 1 (or 0 or another specified value) may indicate deactivation. The electronic device may select a BWP to be activated according to a value of the bit map included in the bandwidth part configuration information on the BWPs.

According to an embodiment, in the case of using DCI, the base station may include information for activating at least one BWP in the DCI. The electronic device may select a BWP to be activated from among a plurality of BWPs, based on the information included in the DCI. If the information included in the DCI is the same as the BWP (e.g., BWP1 622) that is in the activated state, the electronic device may ignore the DCI value, and if information included in the DCI is different from BWP1 622 that is in the activated state, the electronic device may change the activated BWP1 622 to the BWP (e.g., BWP2 624) corresponding to the information included in the DCI, and may activate the same. For example, the electronic device may activate BWP2 624 a predetermined time (e.g., the time in slot units or the time in subframe units) after the reception of the DCI.

According to an embodiment, in the case of using DCI, an index indicating activation/deactivation may be included in the bandwidth part configuration information on the BWPs. The electronic device may select a BWP to be activated based on the index. In an embodiment, indexes of respective BWPs included in the bandwidth part configuration information may be included. For example, if DCI including an index of a BWP to be activated is received, the terminal may activate the corresponding BWP, and may deactivate others.

According to an embodiment, in the case of using an MAC CE, the base station may include information for activating at least one BWP in the MAC CE. The electronic device may select a BWP to be activated from among a plurality of BWPs, based on the information included in the MAC CE. If the information included in the MAC CE is the same as the BWP1 (e.g., BWP1 622) that is in the activated state, the electronic device may ignore the MAC CE, and if information included in the MAC CE is different from BWP1 622 that is in the activated state, the electronic device may change the activated BWP1 622 to the BWP (e.g., BWP2 624) corresponding to the information included in the MAC CE and may activate the same. The electronic device may activate BWP2 624a predetermined time (e.g., the time in slot units or the time in subframe units) after the reception of the MAC CE.

Referring to FIG. 6B, according to various embodiments, BWPs (e.g., carrier bandwidth part0, carrier bandwidth part1, or carrier bandwidth part2) may be allocated within the carrier bandwidth. According to an embodiment, the BWPs may be allocated based on physical resource blocks (hereinafter also referred to as "PRBs") specified in the carrier bandwidth, such as PRB0 601. The PRB may be, for example, a specified bandwidth unit that the electronic device is able to use. According to an embodiment, a plurality of PRBs may be allocated to a plurality of BWPs. For example, a plurality of PRBs N1 to N1+a (602) may be allocated to carrier bandwidth part0, a plurality of PRBs N2 to N2+b (604) may be allocated to carrier bandwidth part1, and a plurality of PRBs N3 to N3+c (606) may be allocated to carrier bandwidth part3. For example, N1, N2, or N3 may be start PRBs, and a, b, or c may indicate the number of bandwidths of the BWP, which may be the number of PRBs.

According to various embodiments, the electronic device may use the bandwidth corresponding to the entire BWP, or may use the bandwidth corresponding to at least one PRB included in the BWP.

Figure 7A:
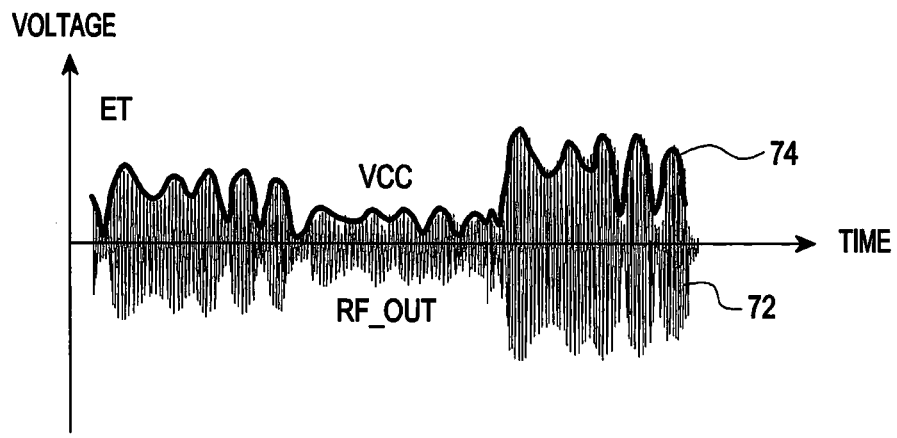
FIGS. 7A and 7B are diagrams for explaining an ET mode and an APT mode according to various embodiments.
Figure 7B:
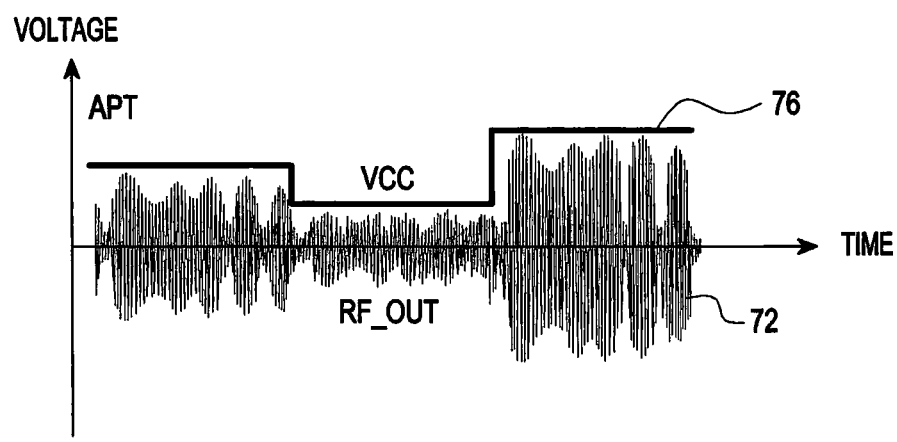

FIGS. 7A and 7B are diagrams for explaining an ET mode and an APT mode according to various embodiments Referring to FIG. 7A, an envelope tracking (ET) mode may be a mode in which a power amplifier (e.g., the power amplifier 230 in FIG. 2, the $1^{st}$ to $n^{th}$ power amplifiers 330-1 to 330-n in FIG. 3, or the $1^{st}$ to $n^{th}$ power amplifiers 430-1 to 430-n in FIG. 4) (hereinafter, the power amplifier 230 in FIG. 2 will be described by way of example) amplifies the power of a transmission signal RF_OUT according to envelopes 74 of an output RF_OUT voltage VCC of a transmission signal 72. According to various embodiments, in the ET mode, a voltage is supplied to the power amplifier 230 to conform to the output of a transmission signal, so the power amplifier 230 may output a transmission signal amplified to have the envelope that is the most similar to the envelope of the transmission signal. According to various embodiments, the ET mode is a mode in which the voltage, which is frequently changed according to the envelope of the transmission signal, is applied to the power amplifier 230, which may consume additional current for changing the voltage. For example, it may be efficient to use the ET mode in an environment where additional current consumption is negligible. According to an embodiment, the ET mode may be used in the case where the current reduction attributable to the usage efficiency of the power amplifier 230 is greater than the additional current consumed in changing the voltage due to the large output of the power amplifier 230. According to various embodiments, it may be efficient to use the ET mode in the case where the power of the transmission signal is greater than a threshold value (hereinafter also referred to as a "second threshold value"). As another example, the ET mode may be used in a manner such that the transmission signal is amplified by reducing the range of fluctuation in voltage even if there is a big change in the envelope of the transmission signal and such that the amplified transmission signal is compensated for by the amount of reduction in the range of fluctuation in voltage. In this case, a method of compensating for the transmission signal by the amount of fluctuation in voltage, such as digital pre-distortion (DPD) or the like, may require a sufficiently wider bandwidth than the bandwidth of the transmission signal. For example, if the bandwidth of a transmission signal is 60 Mhz, the DPD method may require a bandwidth of 200 Mhz or more in order to compensate for the transmission signal by the amount of fluctuation in voltage, and if the bandwidth of the transmission signal is 60 Mhz or more, it may require a bandwidth much greater than 200 Mhz. For example, it may be efficient to use the ET mode in the case where the bandwidth of the transmission signal is less than a threshold value (e.g., 60 MHz) (hereinafter also referred to as a "first threshold value").

Referring to FIG. 7B, an average power tracking (APT) mode may cause the power amplifier 230 to amplify the power of a transmission signal RF_OUT according to the average 76 of the output RF_OUT voltage VCC of the transmission signal 72. Although the usage efficiency of the power amplifier 230 in the APT mode is lower than, for example, in the ET mode because a change in the voltage applied to the power amplifier 230 is not greater than the ET mode, the power generation efficiency in the APT mode may be higher, so the APT mode may be used to amplify the power of the transmission signal in an intermediate band. According to various embodiments, the APT mode may be used in the case where it is inefficient to use the ET mode because the transmission bandwidth is greater than the first threshold value or because the power of the transmission signal is less than the second threshold value.

According to various embodiments, a bandwidth adaptation-based power control method in an electronic device (e.g., the electronic device 101 in FIG. 1, the communication circuit 201 in FIG. 2, the communication circuit 301 in FIG. 3, or the communication circuit 401 in FIG. 4) may include: performing a first determination as to whether or not a carrier bandwidth part of a first signal transmitted through a first antenna exceeds a first threshold value; performing a second determination as to whether or not the power of the first signal exceeds a second threshold value; selecting a first tracking mode as an envelope tracking (ET) mode or an average power tracking (APT) mode, based at least partially on the first determination and the second determination; and controlling a first supply modulator to adjust the power supplied to a first power amplifier configured to amplify the power of the first signal, based on the selected first tracking mode.

According to various embodiments, the bandwidth adaptation-based power control method in an electronic device (e.g., the electronic device 101 in FIG. 1, the communication circuit 201 in FIG. 2, the communication circuit 301 in FIG. 3, or the communication circuit 401 in FIG. 4) may further include: performing a third determination as to whether or not a carrier bandwidth part of a second signal transmitted through a second antenna exceeds a first threshold value; performing a fourth determination as to whether or not the power of the second signal exceeds a second threshold value; selecting a second tracking mode as the ET mode or the APT mode, based at least partially on the third determination and the fourth determination; and controlling a second supply modulator to adjust the power supplied to a second power amplifier configured to amplify the power of the second signal, based on the selected second tracking mode.

According to various embodiments, the bandwidth adaptation-based power control method in an electronic device (e.g., the electronic device 101 in FIG. 1, the communication circuit 201 in FIG. 2, the communication circuit 301 in FIG. 3, or the communication circuit 401 in FIG. 4) may further include receiving information on the carrier bandwidth part from a base station.

According to various embodiments, in the bandwidth adaptation-based power control method in an electronic device (e.g., the electronic device 101 in FIG. 1, the communication circuit 201 in FIG. 2, the communication circuit 301 in FIG. 3, or the communication circuit 401 in FIG. 4), the second determination may be performed after performing the first determination.

According to various embodiments, the method may further include: performing a fifth determination to determine whether or not a bandwidth of the first signal is less than a third threshold value; and selecting a first tracking mode, based at least partially on the fifth determination and the first determination, selecting a first tracking mode, based at least partially on the fifth determination and the second determination, or selecting a first tracking mode, based at least partially on the fifth determination, the first determination, and the second determination.

According to various embodiments, the second signal may be a signal obtained by phase-shifting the first signal, based on a predetermined angle.

According to various embodiments, the information on the carrier bandwidth part may include bandwidth information associated with at least one carrier bandwidth part included in the carrier bandwidth and bandwidth information associated with at least one physical resource block included in the at least one carrier bandwidth part.

According to various embodiments, a mapping table between the carrier bandwidth part and the tracking mode may be used for the first determination.

According to various embodiments, the first antenna and the second antenna may include waveguide array antennas.

Figure 8:
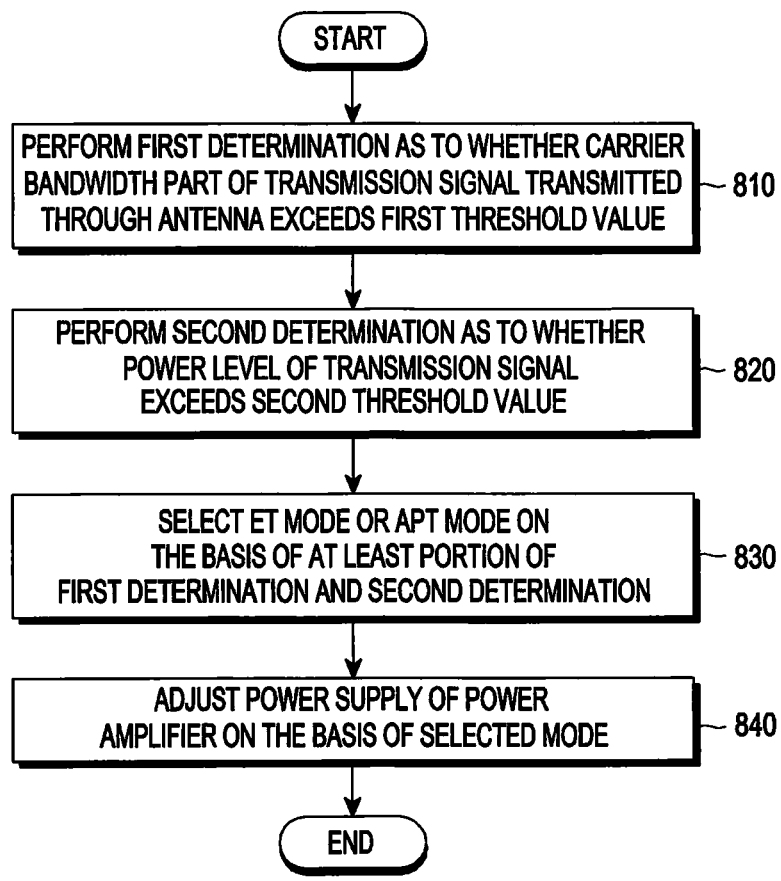
FIG. 8 is a flowchart illustrating a bandwidth adaptation-based power control operation in an electronic device according to various embodiments.

FIG. 8 is a flowchart illustrating a bandwidth adaptation-based power control operation in an electronic device according to various embodiments.

Referring to FIG. 8, in operation 810, a communication processor (e.g., the wireless communication module 192 in FIG. 1, the communication processor 210 in FIG. 2, the communication processor 310 in FIG. 3, or the communication processor 410 in FIG. 4) (hereinafter, the communication processor 410 in FIG. 4 will be described by way of example) of an electronic device (e.g., the electronic device 101 in FIG. 1, the communication circuit 201 in FIG. 2, the communication circuit 301 in FIG. 3, or the communication circuit 401 in FIG. 4) may perform a first determination as to whether or not a carrier bandwidth part of a first signal transmitted through an antenna (e.g., the antenna 270 in FIG. 2, the first antenna 370-1 in FIG. 3, or the first antenna 470-1 in FIG. 4) exceeds a first threshold value.

According to various embodiments, the communication processor 410 may identify the carrier bandwidth part of a first signal transmitted through the antenna 470-1, based on carrier bandwidth part configuration information received from a base station. According to various embodiments, the carrier bandwidth part may be at least a portion of the carrier bandwidth. According to various embodiments, the first threshold value may be a threshold bandwidth capable of controlling a power amplifier (e.g., the power amplifier 230 in FIG. 2, the $1^{st}$ to $n^{th}$ power amplifiers 330-1 to 330-$n$ in FIG. 3, or the $1^{st}$ to $n^{th}$ power amplifiers 430-1 to 430-$n$ in FIG. 4) for amplifying the power of the transmission signal in the ET mode. According to an embodiment, it may be efficient to use the APT mode rather than the ET mode in the case where the carrier bandwidth part of the transmitted first signal exceeds a threshold bandwidth (e.g., 60 MHz), and it may be efficient to use the ET mode rather than the APT mode in the case where the carrier bandwidth part of the transmitted first signal does not exceed a threshold bandwidth. According to various embodiments, the first threshold value may be specified or changed based on the performance of the communication processor or the power amplifier.

In operation 820, the communication processor 410 may perform a second determination as to whether or not the power of the transmission signal exceeds a second threshold value.

According to various embodiments, the second threshold value may be a threshold power capable of controlling a power amplifier (e.g., the power amplifier 230 in FIG. 2, the $1^{st}$ to $n^{th}$ power amplifiers 330-1 to 330-n in FIG. 3, or the $1^{st}$ to $n^{th}$ power amplifiers 430-1 to 430-n in FIG. 4) for amplifying the power of the transmission signal in the ET mode. According to an embodiment, it may be efficient to use the ET mode rather than the APT mode in the case where an output power value of the transmission signal exceeds a threshold power, and it may be efficient to use the APT mode rather than the ET mode in the case where an output power value of the transmission signal to be transmitted does not exceed a threshold power. According to various embodiments, the second threshold value may be specified or changed based on the performance of the communication processor or the power amplifier.

In operation 830, the communication processor 410 may select the ET mode or the APT mode, based at least partially on the first determination and the second determination.

According to various embodiments, the communication processor 410 may select the ET mode if the bandwidth of the carrier bandwidth part does not exceed the first threshold value and if the power of the transmission signal exceeds the second threshold value. As another example, the communication processor 410 may select the APT mode if the carrier bandwidth part exceeds the first threshold value or if the power of the transmission signal does not exceed the second threshold value.

In operation 840, the communication processor 210 may adjust the power supply to the power amplifier, based on the selected mode.

According to various embodiments, if the selected mode is the ET mode, the communication processor 410 may control a supply modulator (e.g., the supply modulator 240 in FIG. 2, the $1^{st}$ to $n^{th}$ supply modulators 340-1 to 340-n in FIG. 3, or the $1^{st}$ to $n^{th}$ supply modulators 440-1 to 440-n in FIG. 4), based on the envelope of the transmission signal, thereby adjusting the power supply to the power amplifier. If the selected mode is the APT mode, the communication processor 410 may control a supply modulator (e.g., the supply modulator 240 in FIG. 2, the $1^{st}$ to $n^{th}$ supply modulators 340-1 to 340-n in FIG. 3, or the $1^{st}$ to $n^{th}$ supply modulators 440-1 to 440-n in FIG. 4), based on the average value of the transmission signal, thereby adjusting the power supply to the power amplifier.

Although it is described by way of example that the communication processor selects the ET mode or the APT mode, based on the carrier bandwidth part and the power of the transmission signal, in the above description, the communication processor may select the ET mode or the APT mode, based on the carrier bandwidth part, the power of the transmission signal, and the actually used bandwidth.

Figure 9:
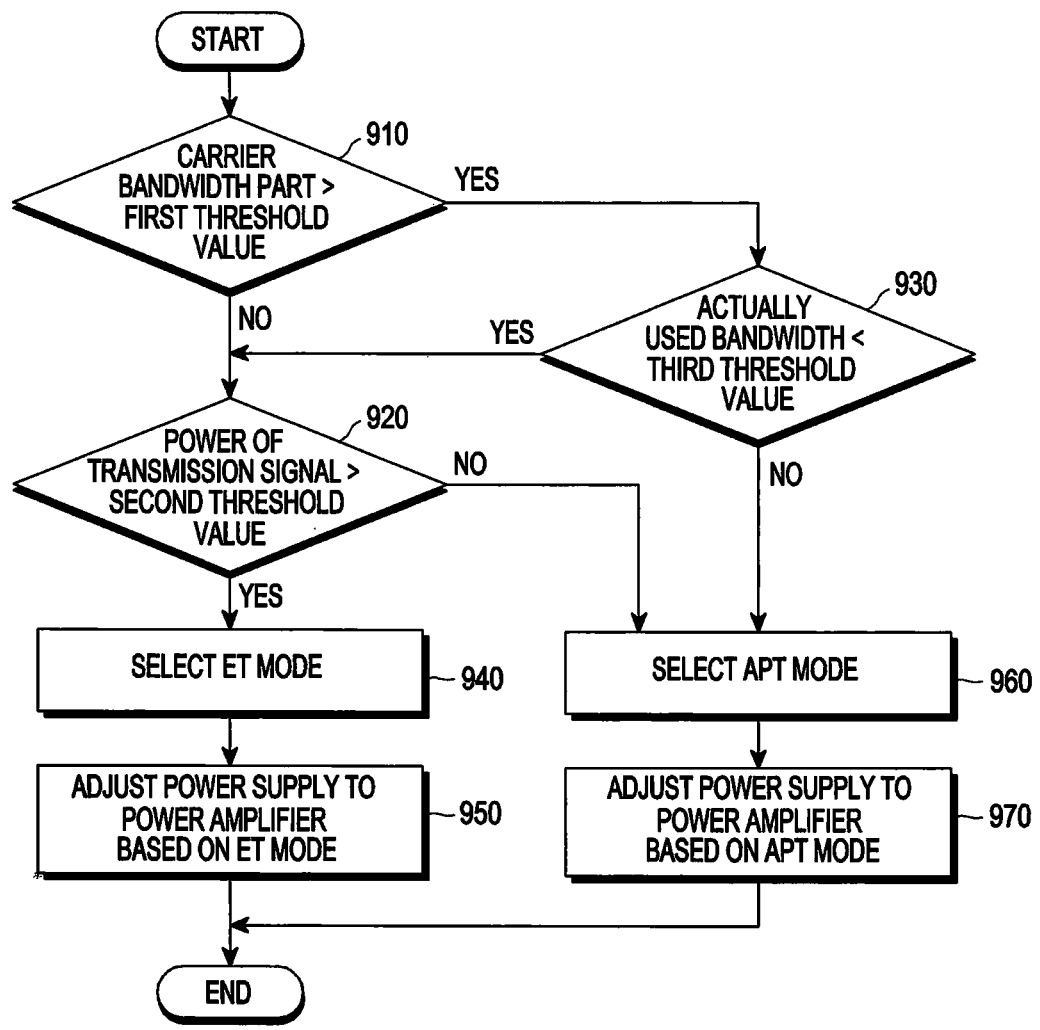
FIG. 9 is a flowchart illustrating an operation of controlling power, based on a carrier bandwidth part, an actually used bandwidth, and the power of a transmission signal in an electronic device according to various embodiments.

FIG. 9 is a flowchart illustrating an operation of controlling power, based on a carrier bandwidth part, an actually used bandwidth, and the power of a transmission signal in an electronic device according to various embodiments.

Referring to FIG. 9, in operation 910, a communication processor (e.g., the wireless communication module 192 in FIG. 1, the communication processor 210 in FIG. 2, the communication processor 310 in FIG. 3, or the communication processor 410 in FIG. 4) (hereinafter, the communication processor 410 in FIG. 4 will be described by way of example) of an electronic device (e.g., the electronic device 101 in FIG. 1, the communication circuit 201 in FIG. 2, the communication circuit 301 in FIG. 3, or the communication circuit 401 in FIG. 4) may perform a first determination as to whether or not a carrier bandwidth part of a first signal transmitted through an antenna (e.g., the antenna 270 in FIG. 2, the first antenna 370-1 in FIG. 3, or the first antenna 470-1 in FIG. 4) exceeds a first threshold value.

According to various embodiments, the communication processor 410 may identify the carrier bandwidth part of a first signal transmitted through the antenna 470-1, based on carrier bandwidth part configuration information received from a base station. According to various embodiments, the carrier bandwidth part may be at least a portion of the carrier bandwidth. According to various embodiments, the first threshold value may be a threshold bandwidth capable of controlling a power amplifier (e.g., the power amplifier 230 in FIG. 2, the $1^{st}$ to $n^{th}$ power amplifiers 330-1 to 330-n in FIG. 3, or the $1^{st}$ to $n^{th}$ power amplifiers 430-1 to 430-n in FIG. 4) for amplifying the power of the transmission signal in the ET mode. According to an embodiment, it may be efficient to use the APT mode rather than the ET mode in the case where the carrier bandwidth part of the transmitted first signal exceeds a threshold bandwidth (e.g., 60 MHz), and it may be efficient to use the ET mode rather than the APT mode in the case where the carrier bandwidth part of the transmitted first signal does not exceed a threshold bandwidth. According to various embodiments, the first threshold value may be specified or changed based on the performance of the communication processor or the power amplifier.

If the carrier bandwidth part of the first signal does not exceed the first threshold value, the communication processor 410 may perform a second determination as to whether or not the power of the transmission signal exceeds a second threshold value in operation 920.

According to various embodiments, the second threshold value may be a threshold power capable of controlling a power amplifier (e.g., the power amplifier 230 in FIG. 2, the $1^{st}$ to $n^{th}$ power amplifiers 330-1 to 330-n in FIG. 3, or the $1^{st}$ to $n^{th}$ power amplifiers 430-1 to 430-n in FIG. 4) for amplifying the power of the transmission signal in the ET mode. According to an embodiment, it may be efficient to use the ET mode rather than the APT mode in the case where the output power value of the transmission signal exceeds a threshold power, and it may be efficient to use the APT mode rather than the ET mode in the case where the output power value of the transmitted transmission signal does not exceed a threshold power. According to various embodiments, the second threshold value may be specified or changed based on the performance of the communication processor or the power amplifier.

If the carrier bandwidth part of the first signal exceeds a first threshold value, the communication processor 410 may perform a fifth determination to determine whether or not the bandwidth used by the first signal is less than a third threshold value in operation 930.

According to various embodiments, the third threshold value may be a bandwidth used to transmit the first signal, among the bandwidths included in the carrier bandwidth part, and may be the bandwidth of at least one PRB included in the carrier bandwidth part. According to an embodiment, even if the carrier bandwidth part exceeds the first threshold value, if the bandwidth used to transmit the first signal is less than the third threshold value (e.g., 60 MHz), it may be efficient to use the ET mode rather than the APT mode. According to various embodiments, the third threshold value may be specified or changed based on the performance of the communication processor or the power amplifier.

If the carrier bandwidth part of the first signal does not exceed a first threshold value and if the power of the transmission signal exceeds a second threshold value, the communication processor 410 may select the ET mode in operation 940, and may adjust the power supply to the power amplifier, based on the ET mode in operation 950.

According to various embodiments, the communication processor 410 may control a supply modulator (e.g., the supply modulator 240 in FIG. 2, the $1^{st}$ to $n^{th}$ supply modulators 340-1 to 340-n in FIG. 3, or the $1^{st}$ to $n^{th}$ supply modulators 440-1 to 440-n in FIG. 4) in the ET mode, based on the envelope of the transmission signal, thereby adjusting the power supply to the power amplifier.

If it is determined that the carrier bandwidth part of the first signal exceeds the first threshold value and that the bandwidth used by the first signal is not less than the third threshold value, if it is determined that the carrier bandwidth part of the first signal exceeds the first threshold value, that the bandwidth used by the first signal is less than the third threshold value, and that the power of the transmission signal is not greater than the second threshold value, or if it is determined that the carrier bandwidth part of the first signal does not exceed the first threshold value and that the power of the transmission signal is not be greater than the second threshold value, the communication processor 410 may select the APT mode in operation 960, and may adjust the power supply to the power amplifier, based on the APT mode, in operation 970.

According to various embodiments, the communication processor 410 may control a supply modulator (e.g., the supply modulator 240 in FIG. 2, the $1^{st}$ to $n^{th}$ supply modulators 340-1 to 340-n in FIG. 3, or the $1^{st}$ to $n^{th}$ supply modulators 440-1 to 440-n in FIG. 4), based on the average value of the transmission signal in the APT mode, thereby adjusting the power supply to the power amplifier.

Figure 10:
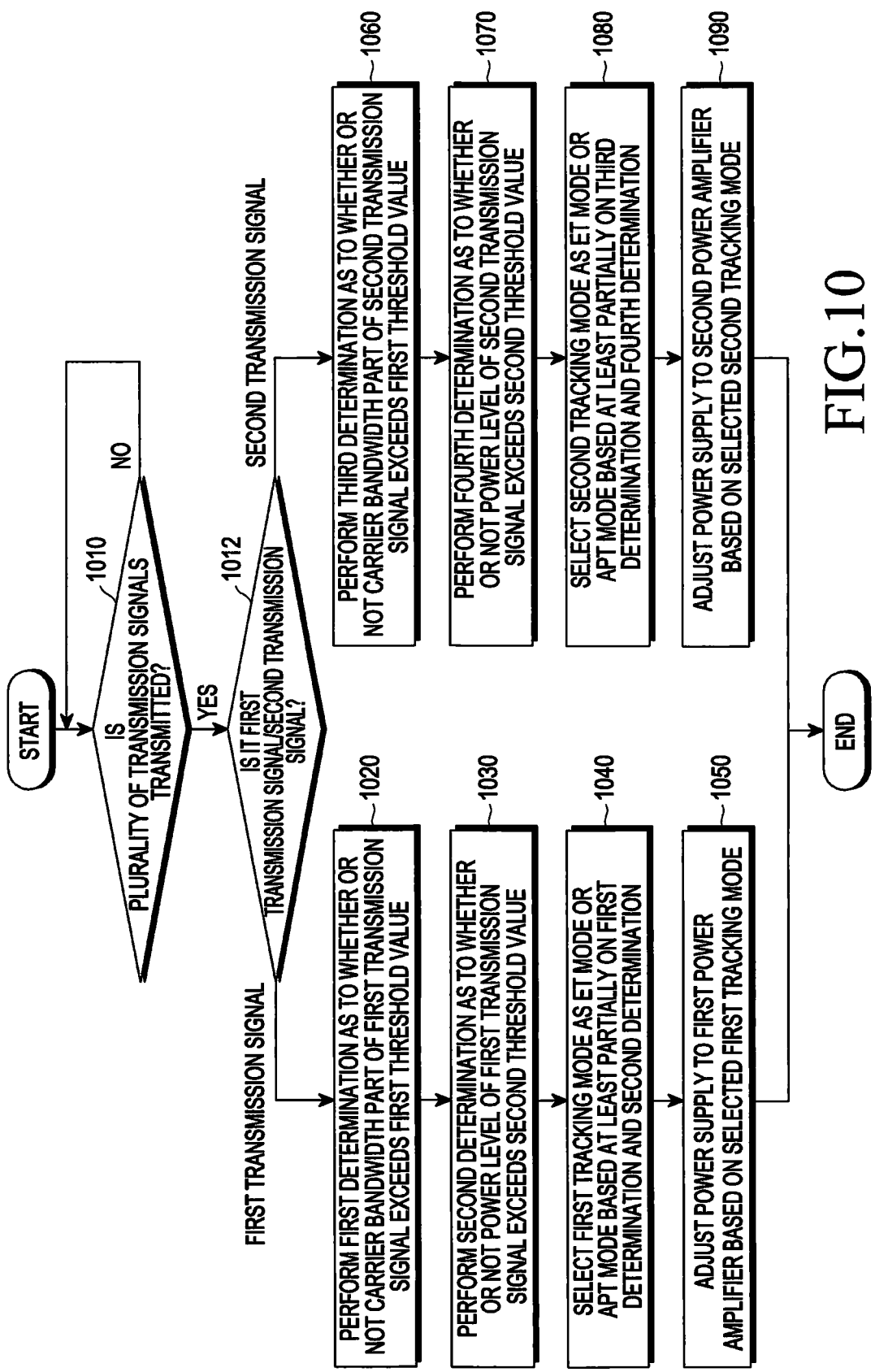
FIG. 10 is a flowchart illustrating a bandwidth adaptation-based power control operation in the case of a plurality of transmission signals in an electronic device according to various embodiments.

FIG. 10 is a flowchart illustrating a bandwidth adaptation-based power control operation in the case where there is a plurality of transmission signals in an electronic device according to various embodiments.

Referring to FIG. 10, a communication processor (e.g., the wireless communication module 192 in FIG. 1, the communication processor 210 in FIG. 2, the communication processor 310 in FIG. 3, or the communication processor 410 in FIG. 4) (hereinafter, the communication processor 410 in FIG. 4 will be described by way of example) of an electronic device (e.g., the electronic device 101 in FIG. 1, the communication circuit 201 in FIG. 2, the communication circuit 301 in FIG. 3, or the communication circuit 401 in FIG. 4) may determine whether or not a plurality of transmission signals is transmitted in operation 1010. According to various embodiments, the plurality of transmission signals may be phase-shifted beamforming signals. According to an embodiment, the plurality of transmission signals may include $1^{st}$ to $n^{th}$ transmission signals.

The communication processor 410 may identify a plurality of transmission signals in operation 1012. Although it will be described by way of example that the plurality of transmission signals includes a first transmission signal and a second transmission signal in the following description, the plurality of transmission signals may include two or more transmission signals. For example, the communication processor 410 may identify whether the signal is the first transmission signal or the second transmission signal.

In operation 1020, the communication processor 410 may perform a first determination as to whether or not a carrier bandwidth part of a first transmission signal transmitted through a first antenna (e.g., the first antenna 370-1 in FIG. 3 or the first antenna 470-1 in FIG. 4) exceeds a first threshold value. According to various embodiments, the communication processor 410 may identify the carrier bandwidth part of a first signal transmitted through the first antenna 470-1, based on carrier bandwidth part configuration information received from a base station. According to various embodiments, the carrier bandwidth part may be at least a portion of the carrier bandwidth. According to various embodiments, the first threshold value may be a threshold bandwidth capable of controlling a first power amplifier (e.g., the first power amplifier 330-1 in FIG. 3 or the first power amplifier 430-1 in FIG. 4) for amplifying the power of the first transmission signal in the ET mode. According to an embodiment, it may be efficient to use the APT mode rather than the ET mode in the case where the carrier bandwidth part of the first transmission signal exceeds a threshold bandwidth (e.g., 60 MHz), and it may be efficient to use the ET mode rather than the APT mode in the case where the carrier bandwidth part of the transmitted first signal does not exceed a threshold bandwidth. According to various embodiments, the first threshold value may be specified or changed based on the performance of the communication processor or the power amplifier.

In operation 1030, the communication processor 410 may perform a second determination as to whether or not the power of the first transmission signal exceeds a second threshold value. According to various embodiments, the second threshold value may be a threshold power capable of controlling a first power amplifier (e.g., the first power amplifier 330-1 in FIG. 3 or the first power amplifier 430-1 in FIG. 4) for amplifying the power of the first transmission signal in the ET mode. According to an embodiment, it may be efficient to use the ET mode rather than the APT mode in the case where an output power value of the first transmission signal exceeds a threshold power, and it may be efficient to use the APT mode rather than the ET mode in the case where an output power value of the transmitted first transmission signal does not exceed a threshold power. According to various embodiments, the second threshold value may be specified or changed based on the performance of the communication processor or the power amplifier.

The communication processor 410 may select a first tracking mode as the ET mode or the APT mode, based at least partially on the first determination and the second determination in operation 1040. According to various embodiments, if the carrier bandwidth part of the first transmission signal does not exceed a first threshold value and if the power of the first transmission signal exceeds a second threshold value, the communication processor 410 may select the ET mode. As another example, if the carrier bandwidth part of the first transmission signal exceeds a first threshold value or if the power of the first transmission signal does not exceed a second threshold value, the communication processor 410 may select the APT mode.

The communication processor 410 may adjust the power supply to the first power amplifier, based on the selected first tracking mode, in operation 1050. According to various embodiments, if the selected mode is the ET mode, the communication processor 410 may control a first supply modulator (e.g., the first supply modulator 340-1 in FIG. 3 or the first supply modulator 440-1 in FIG. 4), based on the envelope of the first transmission signal, thereby adjusting the power supply to the first power amplifier. If the selected mode is the APT mode, the communication processor 410 may control a first supply modulator (e.g., the first supply modulator 340-1 in FIG. 3 or the first supply modulator 440-1 in FIG. 4), based on the average value of the transmission signal, thereby adjusting the power supply to the power amplifier.

In operation 1060, the communication processor 410 may perform a third determination as to whether or not a carrier bandwidth part of a second transmission signal transmitted through a second antenna (e.g., the second antenna 370-2 in FIG. 3 or the second antenna 470-2 in FIG. 4) exceeds a first threshold value. According to various embodiments, the communication processor 410 may identify the carrier bandwidth part of a second signal transmitted through the second antenna 470-2, based on carrier bandwidth part configuration information received from a base station. According to various embodiments, the carrier bandwidth part may be at least a portion of the carrier bandwidth. According to various embodiments, the first threshold value may be a threshold bandwidth capable of controlling a second power amplifier (e.g., the second power amplifier 330-2 in FIG. 3 or the second power amplifier 430-2 in FIG. 4) for amplifying the power of the second transmission signal in the ET mode. According to an embodiment, it may be efficient to use the APT mode rather than the ET mode in the case where the carrier bandwidth part of the second transmission signal exceeds a threshold bandwidth (e.g., 60 MHz), and it may be efficient to use the ET mode rather than the APT mode in the case where the carrier bandwidth part of the transmitted first signal does not exceed a threshold bandwidth. According to various embodiments, the first threshold value may be specified or changed based on the performance of the communication processor or the power amplifier.

In operation 1070, the communication processor 410 may perform a fourth determination as to whether or not the power of the second transmission signal exceeds a second threshold value. According to various embodiments, the second threshold value may be a threshold bandwidth capable of controlling a power amplifier (e.g., the second power amplifier 330-2 in FIG. 3 or the second power amplifier 430-2 in FIG. 4) for amplifying the power of the second transmission signal in the ET mode. According to an embodiment, it may be efficient to use the ET mode rather than the APT mode in the case where the output power value of the second transmission signal exceeds a threshold power, and it may be efficient to use the APT mode rather than the ET mode in the case where the output power value of the transmitted second transmission signal does not exceed a threshold power. According to various embodiments, the second threshold value may be specified or changed based on the performance of the communication processor or the power amplifier.

In operation 1080, the communication processor 410 may select a second tracking mode as the ET mode or the APT mode, based at least partially on the third determination and the fourth determination. According to various embodiments, the communication processor 410 may select the ET mode if the carrier bandwidth part of the second transmission signal does not exceed a first threshold value and if the power of the second transmission signal exceeds a second threshold value. As another example, the communication processor 410 may select the APT mode if the carrier bandwidth part of the second transmission signal exceeds a first threshold value or if the power of the second transmission signal does not exceed a second threshold value.

In operation 1090, the communication processor 210 may adjust the power supply to the second power amplifier, based on the selected second tracking mode. According to various embodiments, if the selected mode is the ET mode, the communication processor 410 may control a second supply modulator (e.g., the second supply modulator 340-2 in FIG. 3 or the second supply modulator 440-2 in FIG. 4), based on the envelope of the transmission signal, thereby adjusting the power supply to the power amplifier. If the selected mode is the APT mode, the communication processor 410 may control a second supply modulator (e.g., the second supply modulator in FIG. 3 or the second supply modulator in FIG. 4), based on the average value of the second transmission signal, thereby adjusting the power supply to the second power amplifier.

Although it is described by way of example that the communication processor 410 selects the ET mode or the APT mode, based on the carrier bandwidth part and the power of the transmission signal, in the above description, the communication processor 410 may select the ET mode or the APT mode, based on the carrier bandwidth part, the power of the transmission signal, and the actually used bandwidth.

According to various embodiments, a communication processor (e.g., the wireless communication module 192 in FIG. 1, the communication processor 210 in FIG. 2, the communication processor 310 in FIG. 3, or the communication processor 410 in FIG. 4) (hereinafter, the communication processor 410 in FIG. 4 will be described by way of example) of an electronic device (e.g., the electronic device 101 in FIG. 1 or the electronic device 201 in FIG. 2) may select a power supply mode, for example, a tracking mode, using a mapping table between carrier bandwidth parts and power supply control modes. According to an embodiment, the mapping table between carrier bandwidth parts and power supply control modes may be configured in the communication processor 410, or may be stored in a separate memory (e.g., the memory 130 in FIG. 1). The communication processor 410 may obtain carrier bandwidth part information, for example, carrier bandwidth part configuration information, through RRC, DCI, MAC CE, or the like from the base station, thereby activating the carrier bandwidth part for communication, and may configure a power supply mode, for example, a tracking mode, corresponding to the activated carrier bandwidth part using the mapping table.

FIGS. 11A and 11B are diagrams illustrating examples of a mapping table between carrier bandwidth parts and power supply modes, which is able to be used in the case where one carrier bandwidth is activated, according to various embodiments.

Referring to FIG. 11A, according to various embodiments, one carrier bandwidth part and one power supply mode may be mapped. For example, carrier bandwidth part BWP1 having a subcarrier spacing (SCS) of 15 kHz and a bandwidth of 5 Mhz may be mapped to the ET mode, BWP2 having a subcarrier spacing of 30 kHz and a bandwidth of 20 Mhz may be mapped to the ET mode, BWP3 having a subcarrier spacing of 60 kHz and a bandwidth of 60 Mhz may be mapped to the APT mode, BWP4 having a subcarrier spacing of 120 kHz and a bandwidth of 100 Mhz may be mapped to the APT mode, and BWP5 having a subcarrier spacing of 240 kHz and a bandwidth of 400 Mhz may be mapped to a bypass mode. The bypass mode may be a mode, for example, in which constant power is supplied regardless of the transmission signal.

Referring to FIG. 11B, according to various embodiments, a plurality of carrier bandwidth parts and one power supply mode may be mapped. For example, a carrier bandwidth part BWP1, BWP3, or BWP5 having a bandwidth of 5 Mhz, 10 Mhz, or 20 Mhz, respectively, may be mapped to an ET mode, a carrier bandwidth part BWP4 or BWP7 having bandwidths of 80 Mhz or 120 Mhz, respectively, may be mapped to an APT mode, and BWP2 having a bandwidth of 400 Mhz may be mapped to a bypass mode.

FIG. 12 is a diagram illustrating an example of a mapping table between carrier bandwidth parts, power supply modes, and supply modulators, which is able to be used in the case where a plurality of carrier bandwidth parts is activated, according to various embodiments.

Referring to FIG. 12, a plurality of carrier bandwidth parts and power supply modes may be mapped, and supply modulators may be further mapped thereto. For example, a carrier bandwidth part BWP1 or BWP2 having a bandwidth of 40 Mhz may be mapped to an ET mode and a first supply modulator. A carrier bandwidth part BWP1, BWP2, or BWP3 having a bandwidth of 140 Mhz may be mapped to an APT mode and a first supply modulator. A carrier bandwidth part BWP2 or BWP3 having a bandwidth of 120 Mhz may be mapped to an APT mode and a first supply modulator, or may be mapped to an ET mode and a second supply modulator. A carrier bandwidth part BWP2 or BWP4 having a bandwidth of 200 Mhz may be mapped to an APT mode and a second supply modulator. A carrier bandwidth part BWP1 or BWP5 having a bandwidth of 500 Mhz may be mapped to a bypass mode and a second supply modulator. According to various embodiments, the power supply modes and the supply modulators may be mapped to each combination of a plurality of different carrier bandwidth parts in addition to the above examples.

According to various embodiments, the communication processor 410 may configure a power supply mode corresponding to the activated carrier bandwidth part using the mapping table, but if the activated carrier bandwidth part is different from the PRBs actually used for communication, the communication processor 410 may change the configuration of the power supply mode. According to an embodiment, since the PRB(s) resource allocated for uplink transmission of an actual terminal may have a smaller carrier bandwidth part than the carrier bandwidth part in every slot/mini-slot, the communication processor 410 may configure a power supply mode using a mapping table, based on the carrier bandwidth part, and may then dynamically reconfigure the power supply mode depending on the PRBs actually used for communication.

According to various embodiments, a communication processor (e.g., the wireless communication module 192 in FIG. 1, the communication processor 210 in FIG. 2, the communication processor 310 in FIG. 3, or the communication processor 410 in FIG. 4) (hereinafter, the communication processor 410 in FIG. 4 will be described by way of example) of an electronic device (e.g., the electronic device 101 in FIG. 1, the communication circuit 201 in FIG. 2, the communication circuit 301 in FIG. 3, or the communication circuit 401 in FIG. 4) may activate at least some carrier bandwidth parts (M carrier bandwidth parts, M being less than or equal to N) among a plurality of carrier bandwidth parts using information on a plurality of carrier bandwidth parts (N carrier bandwidth parts), which is received from a base station.

According to various embodiments, a plurality of carrier bandwidth parts may be included in one carrier bandwidth, for example, a first carrier bandwidth. According to an embodiment, a first carrier bandwidth may be a wideband component carrier, and at least one carrier bandwidth among a plurality of carrier bandwidth parts included in the first carrier bandwidth may overlap a second carrier bandwidth. According to an embodiment, the first carrier bandwidth may be a bandwidth corresponding to an NR component carrier, and the second carrier bandwidth may be a bandwidth corresponding to an LTE component carrier.

FIGS. 13A to 13F are diagrams for explaining a method of configuring a power supply mode depending on an activated carrier bandwidth part according to various embodiments.

Figure 13A:
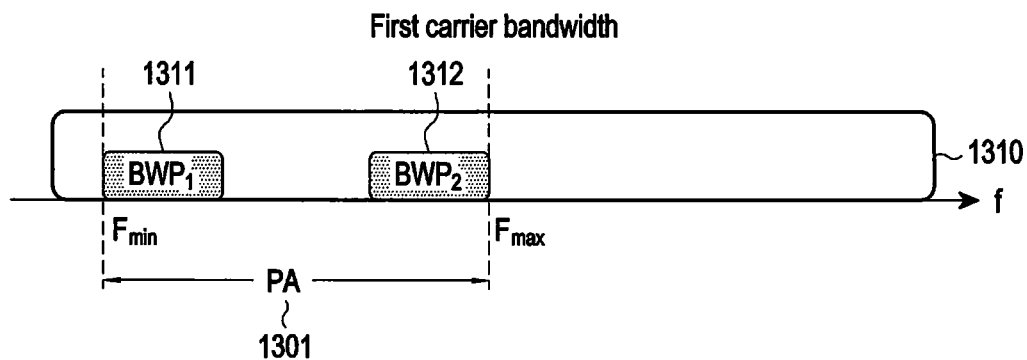
FIGS. 13A to 13F are diagrams for explaining a method of configuring a power supply mode depending on an activated carrier bandwidth part according to various embodiments.

Referring to FIG. 13A, a plurality of carrier bandwidth parts, for example, BWP1 1311 and BWP2 1312, may be activated in one carrier bandwidth, for example, a first carrier bandwidth 1310. According to various embodiments, an operation bandwidth may be determined based on the frequencies of the activated BWP1 1311 and BWP2 1312. According to an embodiment, the difference 1301 between the minimum frequency Fmin of the activated BWP1 1311 and BWP2 1312 and the maximum frequency Fmax thereof may be determined to be an operation bandwidth. According to another embodiment, the bandwidth corresponding to the highest frequency among the frequencies occupied based on BWP1 1311 and BWP2 1312 in a baseband may be determined to be an operation bandwidth. The communication processor 410 may configure a power supply mode, based on the operation bandwidth. For example, the communication processor 410 may configure an ET mode or an APT mode as the power supply mode for one power supply period PA, based on one operation bandwidth.

Figure 13B:
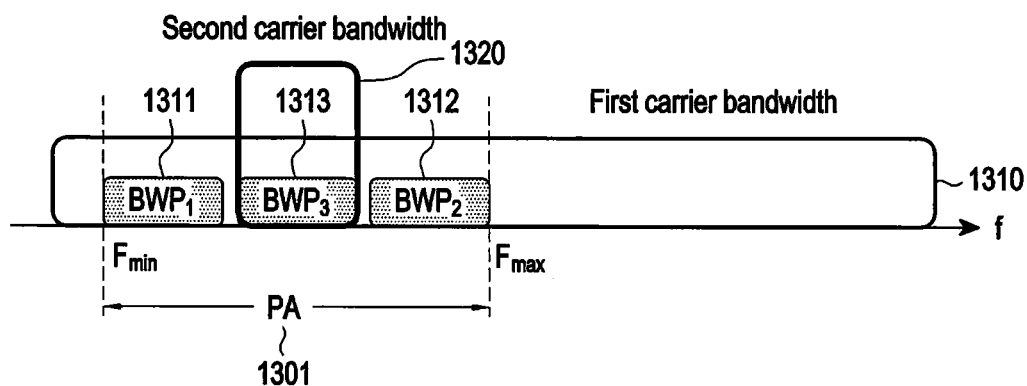

Referring to FIG. 13B, a plurality of carrier bandwidth parts, for example, BWP1 1311, BWP2 1312, and BWP3 1313, may be activated in one carrier bandwidth, for example, a first carrier bandwidth 1310, and at least one among the plurality of carrier bandwidth parts, for example, BWP3 1313, may overlap a second carrier bandwidth 1320. According to an embodiment, the first carrier bandwidth may be a bandwidth corresponding to an NR component carrier, and the second carrier bandwidth may be a bandwidth corresponding to an LTE component carrier. For example, the communication processor 410 may transmit NR or LTE uplink signals through BWP3 1313 in the case where both NR and LTE communication is supported, and may transmit NR uplink signals through BWP3 1313 in the case where only NR communication is supported.

According to various embodiments, an operation bandwidth may be determined based on the frequencies of the activated BWP1 1311, BWP2 1312, and BWP3 1313. According to an embodiment, the difference 1301 between the minimum frequency Fmin of the activated BWP1 1311, BWP2 1312, and BWP3 1313 and the maximum frequency Fmax thereof may be determined to be an operation bandwidth. According to another embodiment, the bandwidth corresponding to the highest frequency among the frequencies occupied based on BWP1 1311, BWP2 1312, and BWP3 1313 in a baseband may be determined to be an operation bandwidth. The communication processor 410 may configure a power supply mode, based on the operation bandwidth. For example, the communication processor 410 may configure an ET mode or an APT mode as the power supply mode for one power supply period PA, based on one operation bandwidth.

Figure 13C:
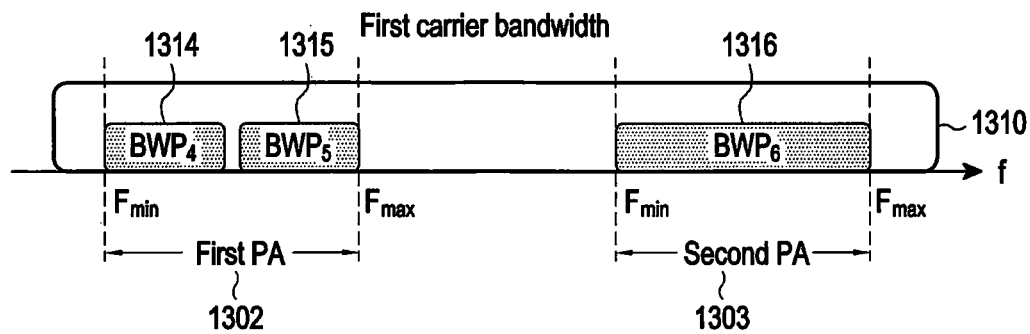

Referring to FIG. 13C, a plurality of carrier bandwidth parts, for example, BWP4 1314, BWP5 1315, and BWP6 1316, may be activated in one carrier bandwidth, for example, a first carrier bandwidth 1310. According to various embodiments, a plurality of operation bandwidths may be determined based on the frequencies of the activated BWP4 1314, BWP5 1315, and BWP6 1316. According to an embodiment, the difference 1302 between the minimum frequency Fmin of the activated BWP4 1314 and BWP5

1315 and the maximum frequency Fmax thereof may be determined to be a first operation bandwidth, and the difference 1303 between the minimum frequency Fmin of BWP6 1316 and the maximum frequency Fmax thereof may be determined to be a second operation bandwidth. The communication processor 410 may configure a power supply mode, based on the first operation bandwidth and the second operation bandwidth. For example, the communication processor 410 may configure an ET mode or an APT mode as the power supply mode for a first power supply period (first PA), based on the first operation bandwidth, and may configure an ET mode or an APT mode as the power supply mode for a second power supply period (second PA), based on the second operation bandwidth.

Figure 13D:
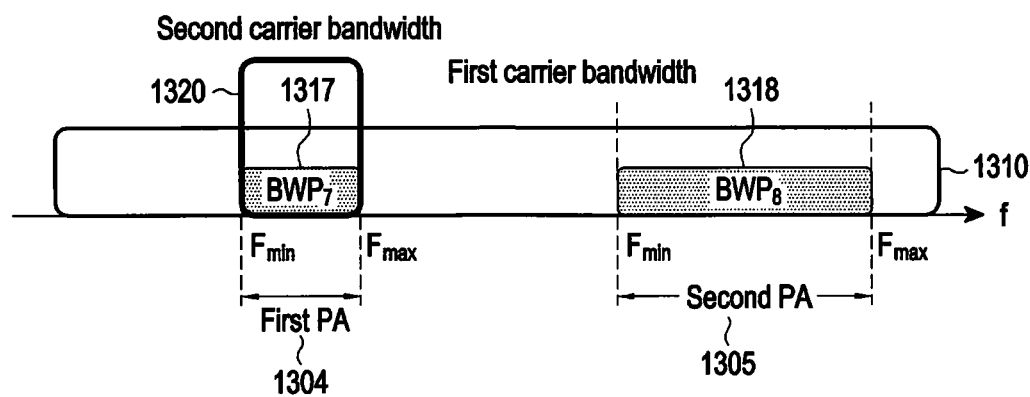

Referring to FIG. 13D, a plurality of carrier bandwidth parts, for example, BWP7 1317 and BWP8 1318, may be activated in one carrier bandwidth, for example, a first carrier bandwidth 1310. At least one among the plurality of carrier bandwidth parts, for example, BWP7 1317, may overlap a second carrier bandwidth 1320. According to an embodiment, the first carrier bandwidth may be a bandwidth corresponding to an NR component carrier, and the second carrier bandwidth may be a bandwidth corresponding to an LTE component carrier. For example, the communication processor 410 may transmit NR or LTE uplink signals through BWP7 1317 in the case where both NR and LTE communication is supported, and may transmit NR uplink signals through BWP7 1317 in the case where only NR communication is supported.

According to various embodiments, an operation bandwidth may be determined based on the frequencies of the activated BWP7 1317 and BWP8 1318. According to an embodiment, the difference 1304 between the minimum frequency Fmin of BWP7 1317 and the maximum frequency Fmax thereof may be determined to be a first operation bandwidth, and the difference 1305 between the minimum frequency Fmin of BWP8 1318 and the maximum frequency Fmax thereof may be determined to be a second operation bandwidth. The communication processor 410 may configure a power supply mode, based on the first operation bandwidth and the second operation bandwidth. For example, the communication processor 410 may configure an ET mode or an APT mode as the power supply mode for a first power supply period (first PA), based on the first operation bandwidth, and may configure an ET mode or an APT mode as the power supply mode for a second power supply period (second PA), based on the second operation bandwidth.

Figure 13E:
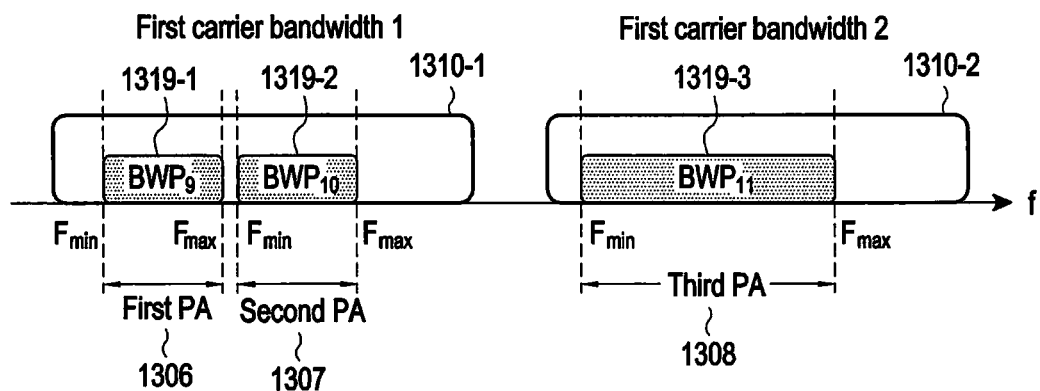

Referring to FIG. 13E, a plurality of carrier bandwidth parts, for example, BWP9 1319-1, BWP10 1319-2, or BWP11 1319-3, may be activated in a plurality of carrier bandwidths, for example, a first carrier bandwidth 1 (1310-1) and a first carrier bandwidth 2 (1310-2). According to various embodiments, a plurality of operation bandwidths may be determined based on the frequency of the activated BWP9 1319-1, BWP10 1319-2, or BWP11 1319-3. According to an embodiment, the differences 1306, 1307, and 1308 between the minimum frequencies Fmin and the maximum frequencies Fmax of the activated BWP9 1319-1, BWP10 1319-2, or BWP11 1319-3 may be determined to be first to third operation bandwidths, respectively. The communication processor 410 may configure a power supply mode, based on the first to third operation bandwidths. For example, the communication processor 410 may configure an ET mode or an APT mode as a power supply mode for a first power supply period (first PA), based on the first operation bandwidth, may configure an ET mode or an APT mode as a power supply mode for a second power supply period (second PA), based on the second operation bandwidth, and may configure an ET mode or an APT mode as a power supply mode for a third power supply period (third PA), based on the third operation bandwidth.

Figure 13F:
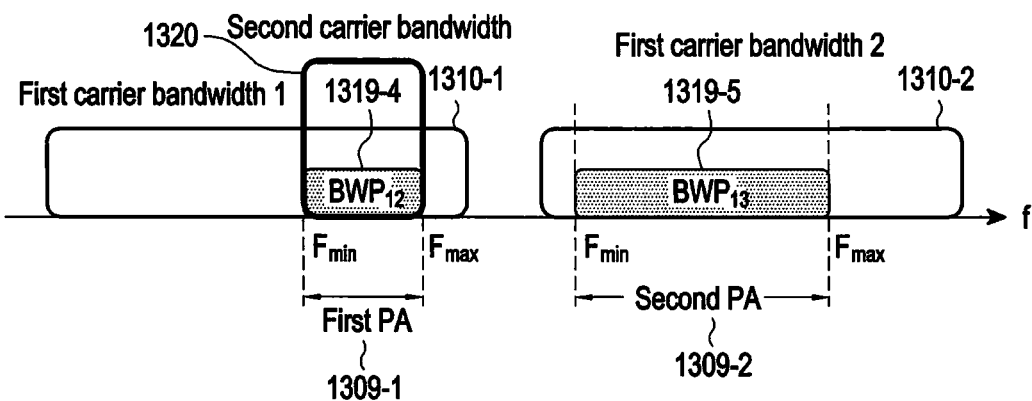

Referring to FIG. 13F, a plurality of carrier bandwidth parts, for example, BWP12 1319-4 or BWP13 1319-5, may be activated in a plurality of carrier bandwidths, for example, a first carrier bandwidth 1 (1310-1) and a first carrier bandwidth 2 (1310-2). At least one among the plurality of carrier bandwidth parts, for example, BWP12 1319-4, may overlap a second carrier bandwidth 1320. According to an embodiment, the first carrier bandwidth may be a bandwidth corresponding to an NR component carrier, and the second carrier bandwidth may be a bandwidth corresponding to an LTE component carrier. For example, the communication processor 410 may transmit NR or LTE uplink signals through BWP12 1319-4 in the case where both NR and LTE communication is supported, and may transmit NR uplink signals through BWP12 1319-4 in the case where only NR communication is supported.

According to various embodiments, an operation bandwidth may be determined based on the frequencies of the activated BWP12 1319-4 and BWP13 1319-5. According to an embodiment, the difference 1309-1 between the minimum frequency Fmin and the maximum frequency Fmax of BWP12 1319-4 may be determined to be a first operation bandwidth, and the difference 1309-2 between the minimum frequency Fmin and the maximum frequency Fmax of BWP13 1319-5 may be determined to be a second operation bandwidth. The communication processor 410 may configure a power supply mode, based on the first operation bandwidth and the second operation bandwidth. For example, the communication processor 410 may configure an ET mode or an APT mode as a power supply mode for a first power supply period, based on the first operation bandwidth, and may configure an ET mode or an APT mode as a power supply mode for a second power supply period, based on the second operation bandwidth.

Figure 14:
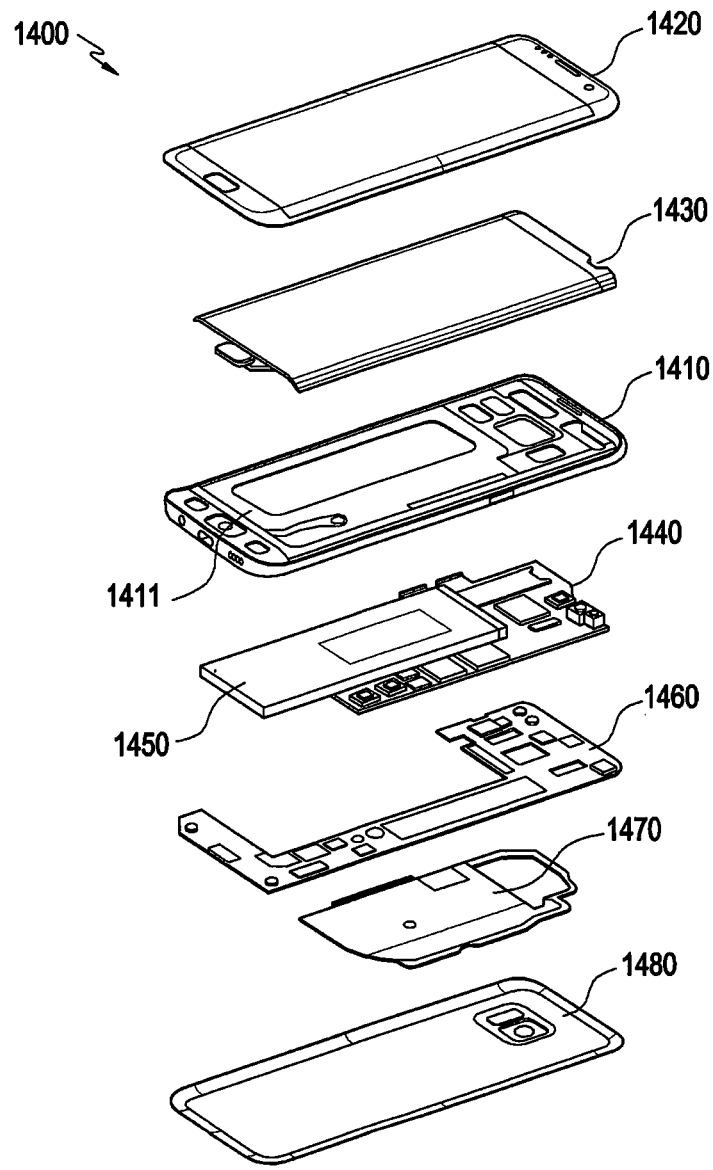
FIG. 14 is an exploded perspective view of an electronic device according to various embodiments.

FIG. 14 is an exploded perspective view of an electronic device according to various embodiments.

Referring to FIG. 14, an electronic device 1400 (e.g., the electronic device 101 in FIG. 1) may include a side bezel structure 1410, a first support member 1411 (e.g., a bracket), a front plate 1420, a display 1430, a printed circuit board 1440, a battery 1450, a second support member 1460 (e.g., a rear case), an antenna 1470, and a rear plate 1480. In some embodiments, the electronic device 1400 may exclude at least one of the elements (e.g., the first support member 1411 or the second support member 1460), or may further include other elements. At least one of the elements of the electronic device 1400 may be the same as or similar to at least one of the elements of the electronic device 100 in FIG. 1 or FIG. 2, and the duplicate description thereof will be omitted below.

The first support member 1411 may be disposed inside the electronic device 1400, and may be connected to the side bezel structure 1410, or may be integrally formed with the side bezel structure 1410. The first support member 1411 may be formed of, for example, a metal material and/or a non-metal (e.g., polymer) material. The first support member 1411 may have the display 1430 coupled to one surface thereof and the printed circuit board 1440 coupled to the opposite surface thereof. The printed circuit board 1440 may have a processor, a memory, and/or an interface mounted thereon. The processor may include, for example, one or more of a central processing unit, an application processor, a graphic processor, an image signal processor, a sensor hub processor, or a communication processor.

The memory may include, for example, a volatile memory or a non-volatile memory.

The interface may include, for example, a high-definition multimedia interface (HDMI), a universal serial bus (USB) interface, an SD card interface, and/or an audio interface. The interface, for example, may electrically or physically connect the electronic device 1400 to an external electronic device, and may include a USB connector, an SD card/MMC connector, or an audio connector.

The battery 1450 is a device for supplying power to at least one element of the electronic device 1400, and may include, for example, a non-rechargeable primary cell, a rechargeable secondary cell, or a fuel cell. At least a portion of the battery 1450 may be disposed in substantially the same plane as, for example, the printed circuit board 1440. The battery 1450 may be integrally disposed inside the electronic device 1400, and may be disposed so as to be attachable to and detachable from the electronic device 1400.

The antenna 1470 may be disposed between the rear plate 1480 and the battery 1450. The antenna 1470 may include, for example, a near-field communication (NFC) antenna, a wireless charging antenna, and/or a magnetic secure transmission (MST) antenna. The antenna 1470, for example, may perform short-range communication with an external device, or may wirelessly transmit and receive power required for charging. In another embodiment, an antenna structure may be formed by a portion of the side bezel structure 1410 and/or the first support member 1411 or by a combination thereof.

Figure 15:
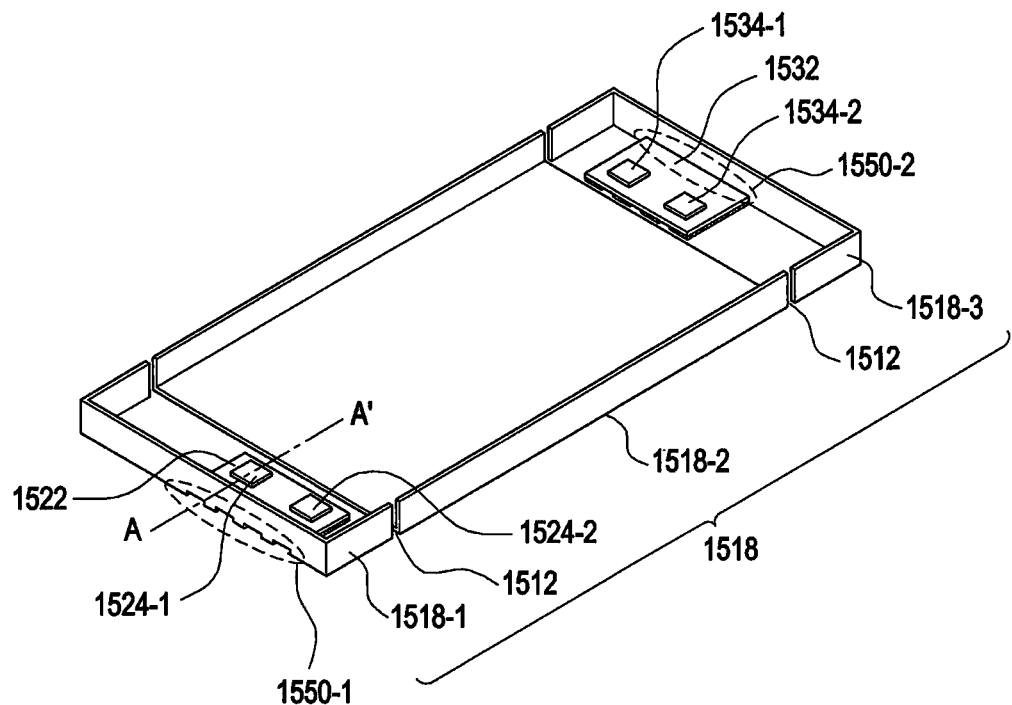
FIG. 15 is a diagram illustrating an antenna according to various embodiments.

FIG. 15 is a diagram illustrating an antenna according to various embodiments.

Referring to FIG. 15, at least a portion of a housing 1518 (e.g., a portion of the side bezel structure 1410 and/or the first support member 1411 in FIG. 14 or a combination thereof) of an electronic device (e.g., the electronic device 101 in FIG. 1 or the electronic device 1400 in FIG. 14) according to various embodiments may be utilized as an antenna. According to an embodiment, the surface of the housing 1518 may be divided into a plurality of structures 1518-1 to 1518-3 by slits 1521. At least some of the plurality of structures 1518-1 to 1518-3 may be utilized as antennas. For example, a first structure 1518-1 (hereinafter also referred to as a "first antenna") and a second structure 1518-2 (hereinafter also referred to as a "second antenna") of the metal housing 1518 may be utilized as respective antennas.

According to various embodiments, each of the first antenna 1518-1 and the second antenna 1518-2 may be connected to an RF circuit of a PCB. According to an embodiment, the first antenna 1518-1 may be connected to a first RF circuit 1524-1 and a second RF circuit 1524-2 of the first PCB 1522, and the second antenna 1518-2 may be connected to a third RF circuit 1534-1 and a fourth RF circuit 1534-2 of the second PCB 1532.

According to various embodiments, each of the first antenna 1518-1 and the second antenna 1518-2 may include an array antenna. According to an embodiment, the array antenna may include a phased array antenna. According to an embodiment, the array antenna may be implemented as a waveguide antenna. For example, the first antenna 1518-1 and the second antenna 1518-2 may include four array antennas, respectively, and may include a first waveguide antenna 1550-1 and a second waveguide antenna 1550-2 corresponding to the four array antennas. According to various embodiments, the first waveguide antenna 1550-1 and the second waveguide antenna 1550-2 may support mmWave bands.

According to various embodiments, the first RF circuit 1524-1 and the second RF circuit 1524-2 may be connected to the first waveguide antenna 1550-1, and the third RF circuit 1534-1 and the fourth RF circuit 1534-2 may be connected to the second waveguide antenna 1550-2. The first RF circuit 1524-1 and the second RF circuit 1524-2, and the third RF circuit 1534-1 and the fourth RF circuit 1534-2 may be mounted to be adjacent to the first waveguide antenna 1550-1 and the second waveguide antenna 1550-2, respectively, in order to reduce transmission line loss.

According to an embodiment, the first RF circuit 1524-1 may be connected to two antennas among the four array antennas included in the first waveguide antenna 1550-1, and the second RF circuit 1524-2 may be connected to the remaining two antennas among the four array antennas included in the first waveguide antenna 1550-1. Likewise, the third RF circuit 1534-1 may be connected to two antennas among the four array antennas included in the second waveguide antenna 1550-2, and the fourth RF circuit 1534-2 may be connected to the remaining two antennas among the four array antennas included in the second waveguide antenna 1550-2. According to various embodiments, the number of antennas is not limited to four, and although it has been described that one RF circuit uses two antennas according to the embodiment, a greater or smaller number of antennas may be used.

According to various embodiments, each of the first antenna 1518-1 and the second antenna 1518-2 of the housing 1518 may further include an antenna in a band of 6 GHz or less. Since a signal in a band of 6 GHz or less does not affect the waveguide antenna because it has a long wavelength, the signal in a band of 6 GHz or less and the signal in a mmWave band, which uses the waveguide antenna, may not interfere with each other. According to various embodiments, each of the first antenna 1518-1 and the second antenna 1518-2 may use the entirety thereof as a legacy antenna, or may use a portion thereof as a waveguide antenna (the first waveguide antenna 1550-2 or the second waveguide antenna 1550-2).

Figure 16:
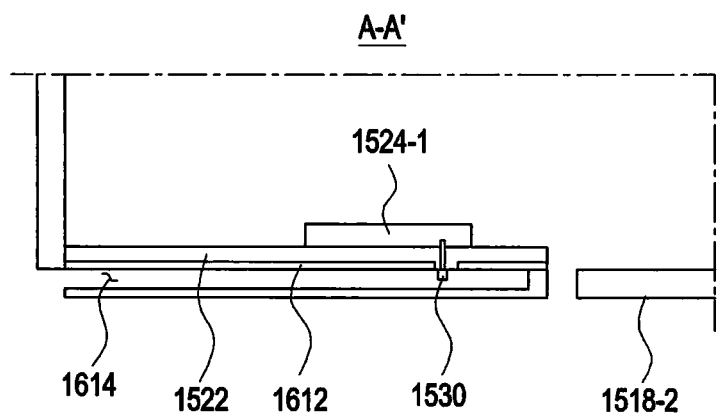
FIG. 16 is a cross-sectional view of an antenna taken along the line A-A' according to various embodiments.

FIG. 16 is a cross-sectional view of an antenna taken along the line A-A' according to various embodiments.

Referring to FIG. 16, an RF circuit (e.g., the first RF circuit 1524-1, the second RF circuit 1524-2, the third RF circuit 1534-1, or the fourth RF circuit 1534-2 in FIG. 15) (hereinafter, the first RF circuit 1524-1 will be described by way of example) may be disposed on a first PCB 1522, and may be connected to a feeder 1530 through a via 1612 of the first PCB 1522. A GND layer 1612 may be included in the bottom of the first PCB 1522, and a space 1614 between the first antenna 1518-1 and the GND layer 1612 may form a waveguide. According to an embodiment, the signal from the first RF circuit 1524-1 may be transmitted through the waveguide.

The metal housing 1518 (e.g., the metal housing 1418 in FIG. 14) of the electronic device 1400 (e.g., the electronic device 101 in FIG. 1 or the electronic device 201 in FIG. 2) according to various embodiments may be used as another type of antenna capable of transmitting signals in bands of 6 GHz or less or signals in mmWave bands, as well as the waveguide-type antenna.

Each of the elements described in this document may be configured as one or more components, and the names of the elements may vary according to the type of electronic device. In various embodiments, the electronic device may be configured to include at least one of the elements described in this document, and may exclude some elements, or may further include other elements. In addition, some of the elements of the electronic device according to various embodiments may be combined into a single entity that is capable of performing the functions of the original elements in the same manner.

The term "module" used in this document may denote, for example, a unit including one of hardware, software, firmware, or a combination thereof. The "module" may be used interchangeably with a term such as unit, logic, logical block, component, circuit, or the like. The "module" may be a minimum unit of an integrally configured element, or may be a part thereof. The "module" may be a minimum unit for performing one or more functions, or may be a part thereof. The "module" may be implemented mechanically or electronically. For example, the "module" may include at least one of application-specific integrated circuit (ASIC) chips, field-programmable gate arrays (FPGAs), or programmable-logic devices (ASICs) for performing specific operations, which are known or are to be developed in the future.

At least a part of a device (e.g., modules or functions thereof) or a method (e.g., operations) according to various embodiments may be implemented as, for example, instructions stored in computer-readable storage media in the form of a program module. If the instructions are executed by a processor (e.g., the processor 120), the one or more processors may perform functions corresponding to the instructions. The computer-readable storage medium may be, for example, the memory 130.

According to various embodiments, there is provided a storage medium storing instructions that, when executed by at least one circuit, cause the at least one circuit to perform one or more operations, wherein the one or more operations may include operations of performing a first determination as to whether or not a carrier bandwidth part of a first signal transmitted through a first antenna exceeds a first threshold value, performing a second determination as to whether or not power of the first signal exceeds a second threshold value, selecting a first tracking mode as an envelope tracking (ET) mode or an average power tracking (APT) mode, based at least partially on the first determination and the second determination, and controlling a first supply modulator to adjust the power supplied to a first power amplifier configured to amplify the power of the first signal, based on the selected first tracking mode.

Computer-readable recording media may include hard disks, floppy disks, magnetic media (e.g., magnetic tapes), optical media (e.g., compact disc read-only memory (CD-ROM), digital versatile discs (DVD), magneto-optical media (e.g., floptical disks), hardware devices (e.g., read-only memory (ROM), random access memory (RAM), or flash memory), and the like. In addition, program commands may include high-level language code that can be executed by a computer using an interpreter, as well as machine language code made by a compiler. The hardware device described above may be configured to operate as one or more software modules to perform the operations of various embodiments, and vice versa.

Modules or program modules according to various embodiments may include at least one of the above-described elements, may exclude some of them, or may further include other elements. The operations performed by modules, program modules, or other elements according to various embodiments may be performed in a sequential, parallel, iterative, or heuristic manner. In addition, some operations may be executed in a different order, or may be omitted, or other operations may be added thereto.

The electronic device of the various embodiments of the disclosure described above is not limited to the above-described embodiments and drawings, and it will be obvious to those skilled in the art that various substitutions, modifications, and changes thereof are possible within the technical scope of the disclosure.

The invention claimed is:

1. An electronic device comprising:
a communication processor;
a transceiver electrically connected to the communication processor;
a first power amplifier electrically connected to the transceiver;
a first antenna electrically connected to the first power amplifier; and
a first supply modulator electrically connected to the communication processor and the first power amplifier,
wherein the communication processor is configured to:
perform a first determination as to whether a first carrier bandwidth part of a first signal transmitted through the first antenna exceeds a first threshold value,
perform a second determination as to whether power of the first signal exceeds a second threshold value after performing the first determination,
select a first tracking mode as one of an envelope tracking (ET) mode or an average power tracking (APT) mode, based at least partially on the first determination and the second determination, and
control the first supply modulator in the selected first tracking mode, and
wherein the communication processor is further configured to:
perform a fifth determination to determine whether a bandwidth of the transmitted first signal is less than a third threshold value, and
select the first tracking mode, based at least partially on the fifth determination and the first determination, select the first tracking mode, based at least partially on the fifth determination and the second determination, or select the first tracking mode, based at least partially on the fifth determination, the first determination, and the second determination.

2. The electronic device of claim 1, further comprising:
a second power amplifier electrically connected to the transceiver;
a second antenna electrically connected to the second power amplifier; and
a second supply modulator electrically connected to the communication processor and the second power amplifier,
wherein the communication processor is configured to:
perform a third determination as to whether a second carrier bandwidth part associated with a second signal transmitted through the second antenna exceeds the first threshold value,
perform a fourth determination as to whether the power of the second signal exceeds the second threshold value,
select a second tracking mode as the ET mode or the APT mode, based at least partially on the third determination and the fourth determination, and
control the second supply modulator in the selected second tracking mode.

3. The electronic device of claim 2, wherein the second signal is a signal obtained by phase-shifting the first signal, based on a predetermined angle.

4. The electronic device of claim 2, wherein the first antenna and the second antenna comprise phased array antennas.

5. The electronic device of claim 2, wherein the first antenna and the second antenna comprise waveguide array antennas.

6. The electronic device of claim 1, wherein the communication processor is configured to receive information on the first carrier bandwidth part from a base station.

7. The electronic device of claim 6, wherein the information on the carrier bandwidth part comprises bandwidth information associated with at least one carrier bandwidth part included in the carrier bandwidth and bandwidth information associated with at least one physical resource block included in the at least one carrier bandwidth part.

8. The electronic device of claim 1, wherein the communication processor is configured to perform the second determination after performing the first determination.

9. The electronic device of claim 1, wherein the communication processor is configured to store a mapping table between the carrier bandwidth part and the tracking mode.

10. A bandwidth adaptation-based power control method in an electronic device, the method comprising:
performing a first determination as to whether a first carrier bandwidth part of a first signal transmitted through a first antenna exceeds a first threshold value;
performing a second determination as to whether power of the first signal exceeds a second threshold value after performing the first determination;
selecting a first tracking mode as an envelope tracking (ET) mode or an average power tracking (APT) mode, based at least partially on the first determination and the second determination; and
controlling a first supply modulator to adjust power supplied to a first power amplifier configured to amplify power of the first signal, based on the selected first tracking mode,
wherein the method further comprises:
performing a fifth determination to determine whether a bandwidth of the first signal is less than a third threshold value; and
selecting a first tracking mode, based at least partially on the fifth determination and the first determination, selecting the first tracking mode, based at least partially on the fifth determination and the second determination, or selecting the first tracking mode, based at least partially on the fifth determination, the first determination, and the second determination.

11. The method of claim 10, further comprising:
performing a third determination as to whether a second carrier bandwidth part of a second signal transmitted through a second antenna exceeds the first threshold value;
performing a fourth determination as to whether the power of the second signal exceeds the second threshold value;
selecting a second tracking mode as the ET mode or the APT mode, based at least partially on the third determination and the fourth determination; and
controlling a second supply modulator to adjust power supplied to a second power amplifier configured to amplify power of the second signal, based on the selected second tracking mode.

12. The method of claim 10, wherein the second determination is performed after performing the first determination.

13. A non-transitory storage medium storing instructions that, when executed by at least one circuit, cause the at least one circuit to perform one or more operations
wherein the one or more operations comprise operations of:
performing a first determination as to whether a first carrier bandwidth part of a first signal transmitted through a first antenna exceeds a first threshold value;
performing a second determination as to whether power of the first signal exceeds a second threshold value after performing the first determination;
selecting a first tracking mode as an envelope tracking (ET) mode or an average power tracking (APT) mode, based at least partially on the first determination and the second determination; and
controlling a first supply modulator to adjust power supplied to a first power amplifier configured to amplify power of the first signal, based on the selected first tracking mode,
wherein the one or more operations further comprise operations of:
performing a fifth determination to determine whether a bandwidth of the first signal is less than a third threshold value; and
selecting a first tracking mode, based at least partially on the fifth determination and the first determination, selecting the first tracking mode, based at least partially on the fifth determination and the second determination, or selecting the first tracking mode, based at least partially on the fifth determination, the first determination, and the second determination.

* * * * *